United States Patent
Han et al.

(10) Patent No.: US 11,981,789 B2
(45) Date of Patent: May 14, 2024

(54) METHOD AND SYSTEM TO MIMIC A RANDOM STRUCTURAL PATTERN

(71) Applicants: STC.UNM, Albuquerque, NM (US); Sang Eon Han, Albuquerque, NM (US); Sang M. Han, Albuquerque, NM (US)

(72) Inventors: Sang Eon Han, Albuquerque, NM (US); Sang M. Han, Albuquerque, NM (US)

(73) Assignee: UNM Rainforest Innovations, Albuquerque, NM (US)

( * ) Notice: Subject to any disclaimer, the term of this patent is extended or adjusted under 35 U.S.C. 154(b) by 846 days.

(21) Appl. No.: 16/647,404

(22) PCT Filed: Sep. 17, 2018

(86) PCT No.: PCT/US2018/051397
§ 371 (c)(1),
(2) Date: Mar. 13, 2020

(87) PCT Pub. No.: WO2019/055950
PCT Pub. Date: Mar. 21, 2019

(65) Prior Publication Data
US 2021/0033531 A1 Feb. 4, 2021

Related U.S. Application Data

(60) Provisional application No. 62/559,313, filed on Sep. 15, 2017.

(51) Int. Cl.
*G01N 21/47* (2006.01)
*B82Y 40/00* (2011.01)
(Continued)

(52) U.S. Cl.
CPC .............. *C08J 9/26* (2013.01); *B82Y 40/00* (2013.01); *G01N 21/278* (2013.01);
(Continued)

(58) Field of Classification Search
CPC ..... C08J 9/26; G01N 21/278; G01N 23/2251; G01N 23/2202; G06T 7/50; H01J 37/26; B82Y 40/00; G02B 5/0268
See application file for complete search history.

(56) References Cited

U.S. PATENT DOCUMENTS

| 8,017,155 | B2 | 9/2011 | Schwendeman et al. |
| 11,118,024 | B2 * | 9/2021 | Liao ............... B01J 20/28085 |
| 2013/0284257 | A1 | 10/2013 | Gilchrist et al. |

FOREIGN PATENT DOCUMENTS

| RU | 2389083 | 5/2010 |
| WO | WO 2000071682 | 11/2000 |
| WO | WO 2017066795 | 4/2017 |

OTHER PUBLICATIONS

N. N. Shi, C.-C. Tsai, F. Camino, G. D. Bernard, N. Yu, and R. Wehner, "Keeping cool: Enhanced optical reflection and radiative heat dissipation in Saharan silver ants," *Science* 349, 298-301 (2015).

(Continued)

*Primary Examiner* — Mathieu D Vargot
(74) *Attorney, Agent, or Firm* — Keith Vogt, Ltd.; Keith A. Vogt

(57) ABSTRACT

A method and resulting device that mimics the light scattering properties of a random structural pattern using microspheres.

10 Claims, 14 Drawing Sheets

(51) Int. Cl.

| | |
|---|---|
| C08J 9/26 | (2006.01) |
| G01N 21/27 | (2006.01) |
| G01N 23/2202 | (2018.01) |
| G01N 23/2251 | (2018.01) |
| G02B 5/02 | (2006.01) |
| G06T 7/50 | (2017.01) |
| H01J 37/26 | (2006.01) |

(52) U.S. Cl.
CPC ..... *G01N 23/2202* (2013.01); *G01N 23/2251* (2013.01); *G02B 5/0268* (2013.01); *G06T 7/50* (2017.01); *H01J 37/26* (2013.01); *G02B 2207/109* (2013.01)

(56) References Cited

OTHER PUBLICATIONS

M. Burresi, L. Cortese, L. Pattelli, M. Kolle, P. Vukusic, D. S. Wiersma, U. Steiner, and S. Vignolini, "Bright-white beetle scales optimise multiple scattering of light," Sci. Rep. 4, 6075 (2014).
F. Trombe, "Nouvelles experiences sur le refroidissement de corps noirs rayonnant sur l'espace. Essais d'un dispositif a cinq etages de radiateurs.," C. R. Acad. Sci. Paris 256, 2013-2015 (1963).
C. G. Granqvist and A. Hjortsberg, "Radiative cooling to low temperatures: General considerations and application to selectively emitting SiO films," J. Appl. Phys. 52, 4205-4220 (1981).
A. P. Raman, M. A. Anoma, L. Zhu, E. Rephaeli, and S. Fan, "Passive radiative cooling below ambient air temperature under direct sunlight," Nature 515, 540-544 (2014).
C. S. Wojtysiak and J. W. Butler, "Radiative cooling surface coatings," U.S. Pat. No. 7,503,971 B2 (2009).
S. Atiganyanun, J. Plumley, K. Hsu, J. Cytrynbaum, T. L. Peng, S. M. Han, and S. E. Han, "Effective Radiative Cooling by Photonic Random Media," Appl. Phys. Lett., submitted (2017).
S. E. Han and S. M. Han, "Microsphere-Based Coatings for Radiative Cooling under Direct Sunlight," Patent Application No. PCT/US16/57407 (2016).
Y. Zhai, Y. Ma, S. N. David, D. Zhao, R. Lou, G. Tan, R. Yang, and X. Yin, "Scalable-manufactured randomized glass-polymer hybrid metamaterial for daytime radiative cooling," Science (in print).
C. F. Bohren and D. R. Huffman, Absorption and Scattering of Light by Small Particles, (John Wiley & Sons, New York, 1983).
A. Ishimaru, Wave Propagation and Scattering in Random Media, vol. 1, (Academic Press, New York, 1978).
P. Sheng, Introduction to Wave Scattering, Localization, and Mesoscopic Phenomena, (Academic Press, 1995).
P. W. Anderson, "Absence of diffusion in certain random lattices," Phys. Rev. 109, 1492-1505 (1958).
J. X. Zhu, D. J. Pine, and D. A. Weitz, "Internal reflection of diffusive light in random media," Phys. Rev. A 44, 3948-3959 (1991).
D. J. Durian, "Influence of boundary reflection and refraction on diffusive photon transport," Phys. Rev. E 50, 857-866 (1994).
D. Contini, F. Martelli, and G. Zaccanti, "Photon migration through a turbid slab described by a model based on diffusion approximation. I. Theory," Appl. Opt. 36, 4587-4599 (1997).
K. Busch, C. M. Soukoulis, and E. N. Economou, "Transport and scattering mean free paths of classical waves," Phys. Rev. B 50, 93-98 (1994).
J.-L. Kou, Z. Jurado, Z. Chen, S. Fan, and A. J. Minnich, "Daytime Radiative Cooling Using Near-Black Infrared Emitters," ACS Photon. 4, 626-630 (2017).
A. R. Gentle and G. B. Smith, "A Subambient Open Roof Surface under the Mid-Summer Sun," Adv. Sci. 2, 1500119 (1-4) (2015).
N. W. Ashcroft and N. H. March, "Structure Factor and Direct Correlation Function for a Classical Hard Sphere Fluid," Proc. R. Soc. A. 297, 336-350 (1967).
T. E. Kodger, R. E. Guerra, and J. Sprakel, "Precise colloids with tunable interactions for confocal microscopy," Sci. Rep. 5, 14635 (2015).
A. Statt, R. Pinchaipat, F. Turci, R. Evans, and C. P. Royall, "Direct observation in 3d of structural crossover in binary hard sphere mixtures," J. Chem. Phys. 144, 144506 (2016).
D. Semwogerere and E. R. Weeks, "Confocal microscopy," in *Encyclopedia of biomaterials and biomedical engineering* (Taylor & Francis, 2005).
M. S. Wertheim, "Exact Solution of the Percus-Yevick Integral Equation for Hard Spheres," Phys. Rev. Lett. 10, 321-323 (1963).
G. J. Throop and R. J. Bearman, "Numerical Solutions of the Percus-Yevick Equation for the Hard-Sphere Potential," J. Chem. Phys. 42, 2408-2411 (1965).
E. Thiele, "Equation of State for Hard Spheres," J. Chem. Phys. 39, 474-479 (1963).
P. Vukusic, B. Hallam, and J. Noyes, "Brilliant Whiteness in Ultrathin Beetle Scales," Science 315, 348 (2007).
A. Kienle, "Anisotropic Light Diffusion: An Oxymoron?," Phys. Rev. Lett. 98, 218104 (2007).
P. M. Johnson and A. Lagendijk, "Optical anisotropic diffusion: new model systems and theoretical modeling," J. Biomed. Opt. 14, 054036 (2009).
D. S. Wiersma, P. Bartolini, A. Lagendijk, and R. Righini, "Localization of light in a disordered medium," Nature 390, 671-673 (1997).
R. Sapienza, P. D. García, J. Bertolotti, M. D. Martín, Á. Blanco, L. Viña, C. López, and D. S. Wiersma, "Observation of resonant behavior in the energy velocity of diffused light," Phys. Rev. Lett. 99, 233902 (2007).
B. T. Hallam, A. G. Hiorns, and P. Vukusic, "Developing optical efficiency through optimized coating structure: biomimetic inspiration from white beetles," Appl. Opt. 48, 3243-3249 (2009).
S. M. Luke, B. T. Hallam, and P. Vukusic, "Structural optimization for broadband scattering in several ultra-thin white beetle scales," Appl. Opt. 49, 4246-4254 (2010).
F. J. P. Schuurmans, D. Vanmaekelbergh, J. v. d. Lagemaat, and A. Lagendijk, "Strongly photonic macroporous gallium phosphide networks," Science 284, 141-143 (1999).
P. D. García, R. Sapienza, Á. Blanco, and C. López, "Photonic glass: a novel random material for light," Adv. Mater. 19, 2597-2602 (2007).
E. J. Lavernia and Y. Wu, Spray Atomization and Deposition, (John Wiley, New York, 1996).
P. D. García, R. Sapienza, J. Bertolotti, M. D. Martín, Á. Blanco, A. Altube, L. Viña, D. S. Wiersma, and C. López, "Resonant light transport through Mie modes in photonic glasses," Phys. Rev. A 78, 023823 (2008).
V. Scardaci, R. Coull, P. E. Lyons, D. Rickard, and J. N. Coleman, "Spray deposition of highly transparent, low-resistance networks of silver nanowires over large areas," Small 7, 2621-2628 (2011).
R. H. Fernando, L. L. Xing, and J. E. Glass, "Rheology parameters controlling spray atomization and roll misting behavior of waterborne coatings," Prog. Org. Coat. 40, 35-38 (2000).
J. E. Glass, "Technology for Waterborne Coatings," American Chemcial Society Symposium Series 663, Washington DC, 1997, pp. 265-295.
G. Y. Onoda and E. G. Liniger, "Random loose packings of uniform spheres and the dilatancy onset," Phys. Rev. Lett. 64, 2727-2730 (1990).
M. Nogami and Y. Moriya, "Glass formation through hydrolysis of $Si(OC_2H_5)_4$ with $NH_4OH$ and HCl solution," J. Non-Cryst. Solids 37, 191-201 (1980).
S. Fraden and G. Maret, "Multiple light scattering from concentrated, interacting suspensions," Phys. Rev. Lett. 65, 512-515 (1990).
S. G. Johnson, M. Ibanescu, M. A. Skorobogatiy, O. Weisberg, J. D. Joannopoulos, and Y. Fink, "Perturbation theory for Maxwell's equations with shifting material boundaries," Physical Review E 65, 066611 (2002).
S. Hughes, L. Ramunno, J. F. Young, and J. E. Sipe, "Extrinsic Optical Scattering Loss in Photonic Crystal Waveguides: Role of Fabrication Disorder and Photon Group Velocity," Physical Review Letters 94, 033903 (2005).

(56) References Cited

OTHER PUBLICATIONS

S. G. Johnson, M. L. Povinelli, M. Soljaičć, A. Karalis, S. Jacobs, and J. D. Joannopoulos, "Roughness losses and volume-current methods in photonic-crystal waveguides," *Applied Physics* B 81, 283-293 (2005).
L. Ramunno and S. Hughes, "Disorder-induced resonance shifts in high-index-contrast photonic crystal nanocavities," *Physical Review B* 79, 161303 (2009).
K. Vynck, M. Burresi, F. Riboli, and D. S. Wiersma, "Photon management in two-dimensional disordered media," *Nat. Mater.* 11, 1017-1022 (2012).
V. E. Ferry, M. A. Verschuuren, M. C. v. Lare, R. E. I. Schropp, H. A. Atwater, and A. Polman, "Optimized Spatial Correlations for Broadband Light Trapping Nanopatterns in High Efficiency Ultrathin Film a-Si:H Solar Cells," *Nano Lett.* 11, 4239-4245 (2011).
E. R. Martins, J. Li, Y. Liu, V. Depauw, Z. Chen, J. Zhou, and T. F. Krauss, "Deterministic quasi-random nanostructures for photon control," *Nat. Commun.* 4, 2665 (2013).
S. Atiganyanun, M. Zhou, O. K. Abudayyeh, S. M. Han, and S. E. Han, "Control of Randomness in Microsphere-Based Photonic Crystals Assembled by Langmuir-Blodgett Process," *Langmuir*, submitted (2017).
A. Blanco, E. Chomski, S. Grabtchak, M. Ibisate, S. John, S. W. Leonard, C. Lopez, F. Meseguer, H. Miguez, J. P. Mondia, G. A. Ozin, O. Toader, and H. M. van Driel, "Large-scale synthesis of a silicon photonic crystal with a complete three-dimensional bandgap near 1.5 micrometres," *Nature* 405, 437-440 (2000).
J. E. G. J. Wijnhoven and W. L. Vos, "Preparation of photonic crystals made of air spheres in titania," *Science* 281, 802-804 (1998).
P. N. Pusey, W. van Megen, P. Bartlett, B. J. Ackerson, J. G. Rarity, and S. M. Underwood, "Structure of crystals of hard colloidal spheres," *Phys. Rev. Lett.* 63, 2753-2756 (1989).
N. R. Denny, S. E. Han, D. J. Norris, and A. Stein, "Effects of thermal processes on the structure of monolithic tungsten and tungsten alloy photonic crystals," *Chem. Mater.* 19, 4563-4569 (2007).
J. G. Berryman, "Measurement of spatial correlation functions using image processing techniques," *J. Appl. Phys.* 57, 2374-2384 (1985).
J. G. Berryman and S. C. Blair, "Use of digital image analysis to estimate fluid permeability of porous materials: Application of two-point correlation functions," *J. Appl. Phys.* 60, 1930-1938 (1986).
P. A. Kralchevsky and K. Nagayama, "Capillary forces between colloidal particles," *Langmuir* 10, 23-36 (1994).
Y. Masuda, T. Itoh, and K. Koumoto, "Self-Assembly and Micropatterning of Spherical-Particle Assemblies," *Adv. Mater.* 17, 841-845 (2005).
N. Tsapis, E. R. Dufresne, S. S. Sinha, C. S. Riera, J. W. Hutchinson, L. Mahadevan, and D. A. Weitz, "Onset of Buckling in Drying Droplets of Colloidal Suspensions," *Phys. Rev. Lett.* 94, 018302 (2005).
Carbit, https://carbit.com/predict-thickness-paint/.
M. M. Hossain and M. Gu, "Radiative Cooling: Principles, Progress, and Potentials," *Adv. Sci.* 3, 1500360 (1-10) (2016).
N. Kaya, H. Yutaka, O. Yoshimichi, and Y. Kichinosuke, "Improvement of Radiation Resistance of Pure Silica Core Fibers by Hydrogen Treatment," *Jap. J. Appl. Phys.* 24, 1224 (1985).
J. B. Plumley, A. Cook, C. A. Larsen, K. Artyushkova, S. M. Han, T. Peng, and R. Kemp, Crystallization of ITO Thin Films by Wavelength Range Specific Pulsed Xe Arc-Lamp Annealing (in preparation).
C. D. Fields, http://diverseeducation.com/article/8425/ "A scant presence—Black and Latino faculty at research institutions—includes related article," Diverse Issues in Higher Education (2007).
T. Cai and S. E. Han, "Effect of symmetry in periodic nanostructures on light trapping in thin film solar cells," *J. Opt. Soc. Am. B* 32, 2264-2270 (2015).
S. Ghosh, D. Kaiser, J. Bonilla, T. Sinno, and S. M. Han, "Stress-Directed Compositional Patterning of SiGe Substrates for Lateral Quantum Barrier Manipulation," *Appl. Phys. Lett.* 107, 072106-1:5 (2015).
S. Ghosh, S. J. Han, B. R. Hoard, E. C. Culler, J. Bonilla, S. M. Han, and S. E. Han, Symmetry-breaking nanostructures on crystalline silicon for enhanced light-trapping in thin film solar cells, (under review).
Q. Li, J. L. Krauss, S. Hersee, and S. M. Han, "Probing Interactions of Ge with Chemical and Thermal SiO2 to Understand Selective Growth of Ge on Si during Molecular Beam Epitaxy," *J. Phys. Chem. C* 111, 779-786 (2006).
M. R. Kosuri, R. Cone, Q. Li, S. M. Han, B. C. Bunker, and T. M. Mayer, "Adsorption Kinetics of 1-Alkanethiols on Hydrogenated Ge(111)," *Langmuir* 20, 835-840 (2003).
T. J. Boyle, L. J. Tribby, L. A. Ottley, and S. M. Han, "Synthesis and Characterization of Germanium Coordination Compounds for Production of Germanium Nanomaterials," *Eur. J. Inorg. Chem.* 36, 5550-5560 (2009).
http://www.dol.gov/odep/topics/youth/softskills/ "Soft Skills to Pay the Bills—Mastering Soft Skills for Workplace Success," U.S. Department of Labor (2007).
C. Kittel, Introduction to Solid State Physics, (Wiley, 2004).
https://oja.unm.edu/facts-and-figures/data-visualizations/Enrollment.html "Enrollment," UNM Office of Institutional Analytics (2016).
Russian ISA; International Search Report & Written Opinion for PCT/.US2018/051397; dated Feb. 7, 2019; 9 pages.

\* cited by examiner

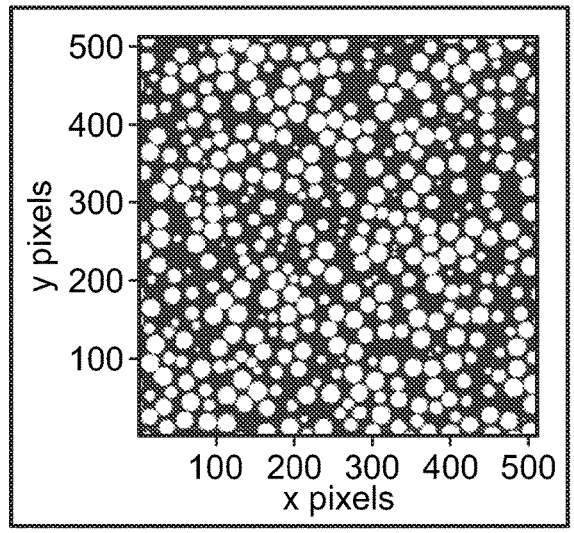
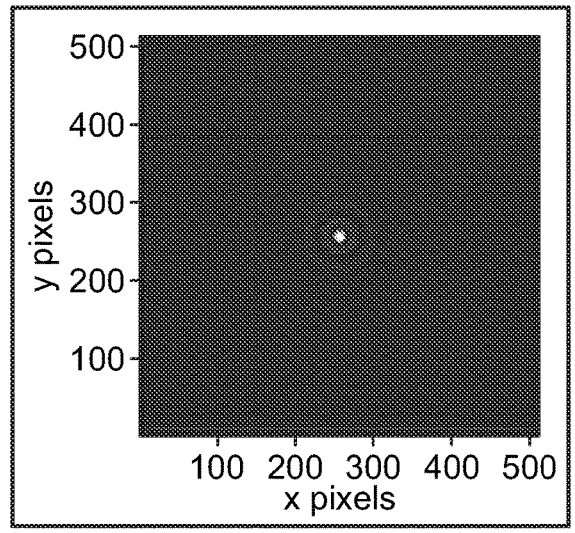
FIG. 5A  FIG. 5B
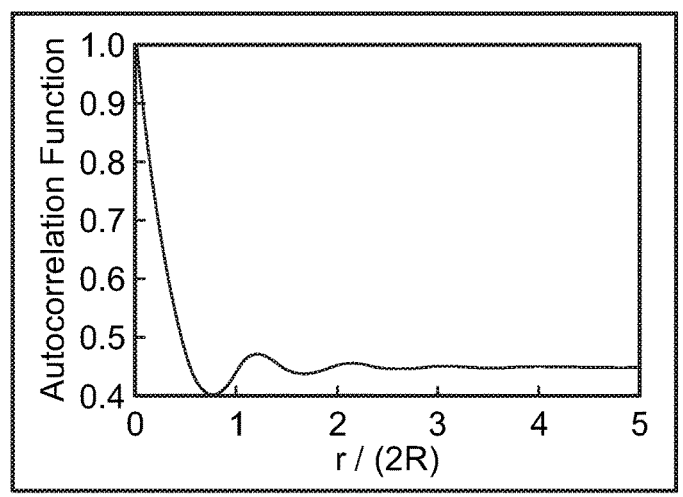
FIG. 5C

FIG. 13A  FIG. 13B  FIG. 13C

METHOD AND SYSTEM TO MIMIC A RANDOM STRUCTURAL PATTERN

RELATED APPLICATIONS

This application claims priority to U.S. Provisional Application Ser. No. 62/559,313 filed on Sep. 15, 2018, which is hereby incorporated by reference.

STATEMENT REGARDING FEDERALLY SPONSORED RESEARCH & DEVELOPMENT

This invention was made with funding by the National Science Foundation, Grant No. 1555290. The government may have certain rights in this invention.

BACKGROUND OF THE INVENTION

Biological structures found in nature, such as white beetle scales, display exceptionally strong light scattering power from a thin random biopolymer network. Despite the significant advances made in understanding light scattering in random media, man-made white materials have not been able to match nature's performance. To harness such extraordinary physical properties, the real-space geometry of the biological systems may be replicated but only to realize that mimicking intricately random biological structures is dauntingly difficult and cumbersome.

BRIEF SUMMARY OF THE INVENTION

In one embodiment, the present invention, instead of mimicking the intricately random biological structures, takes a completely different biomimetic approach and concerns synthetic structures that are different from the biological structures but nevertheless exhibit similar light scattering properties. In a preferred embodiment, the designs may be configured to share a similar structure factor.

In other embodiments, a shared structure-related mathematical function may be used to determine optical scattering.

In other embodiments, the present invention may involve using materials that mimic the nature's way of scattering light. Such materials may include simple building blocks of microspheres, composite films that consist of solid/hollow microspheres, and polymers. These materials may be used so as to allow flexible control over the refractive index, characteristic dimension, fill fraction, structural anisotropy, and ultimately photon transport mean free path.

An understanding of how light interacts with photonically random, anisotropic media has broad implications, including spectrally tunable light scattering and emissivity. To illustrate, such dual properties are at the heart of radiative passive cooling phenomenon, where a thin layer of highly scattering medium for the solar spectrum with high mid-infrared emissivity can encapsulate an object and reduce its temperature below the ambient air even under the intense summer solar radiation.

In other embodiments, the present invention focusses on radiative passive cooling within the context of fundamentally understanding the structure-light scattering property relationship. The cooling properties of the materials of the present invention may be used in terrestrial and extraterrestrial environs. Other benefits of radiative passive cooling that may range from solar heat management of space vehicles to heat signature control of warfighters.

In other aspects, the present invention provides a method to mimic the light scattering properties of a random structural pattern comprising the steps of: obtaining an image of the surface of the pattern, the image including a plurality of pixels representing the pattern; for each pixel of the pattern assigning an intensity value based on the absence or presence of material to create an intensity map; extracting the structure factor from the intensity map and converting the structure factor into a real-space structure that consists of microspheres; and fabricating the real-space structure using microspheres that mimics the structure factor of the imaged pattern. The imaged structure may be a random pattern of fibrils.

In other aspects, the present invention provides a method to create a structure that mimics the light scattering properties of a random structural pattern comprising the steps of: infiltrating a structure with a polymer to create multiple layer composite; polishing the composite in a layer-by-layer fashion to expose a portion of the random structural pattern; intermittently capturing SEM images of the exposed portion and obtaining an image of the surface of the exposed portion; and finding the radial distribution of the random structural pattern from the SEM images to determine the structure factor of the random structural pattern.

In other aspects, the present invention provides a radial distribution function that is determined in three directions.

In other aspects, the present invention provides a radial distribution function that is used to fabricate microsphere-based structures that mimic the radial distribution function of a random structural pattern.

In other aspects, the present invention provides a method of fabrication that includes the step of using colloidal sedimentation to create randomly packed microspheres.

In other aspects, the present invention provides a method of fabrication that includes the step of using spray coating microspheres to create randomly packed microspheres.

In other aspects, the present invention provides a method of fabrication wherein an electrolyte is added.

In other aspects, the present invention provides a method of fabrication wherein an electrolyte is added to a stable colloidal suspension of $SiO_2$ microspheres.

In other aspects, the present invention provides a method of fabrication wherein an electrolyte is added to a concentration that exceeds the critical coagulation concentration so as to creator increase the randomness of a structure.

In other aspects, the present invention provides a method of fabrication that includes accelerating sedimentation by centrifugation.

In other aspects, the present invention provides a method of fabrication that further includes the step of adding a surfactant to a spray coating to increase the degree of randomness of the coating.

In other aspects, the present invention provides a method to mimic the light scattering properties of a random structural pattern comprising the steps of: extracting the structure factor from a random structure and converting the structure factor into a real-space structure that consists of microspheres; and fabricating the real-space structure using microspheres that mimics the structure factor of the imaged pattern.

In other aspects, the present invention provides a method to create a microsphere based structure that mimics the light scattering properties of a random structural pattern comprising the steps of: infiltrating a structure with a polymer to create a microsphere-polymer composite; removing the microspheres to create a polymer structure; and applying stress to the polymer structure.

In other aspects, the present invention provides a method of fabrication wherein microspheres are removed by etching.

In other aspects, the present invention provides a method of fabrication wherein stress is applied by mechanically manipulating the polymer structure.

In other aspects, the present invention provides a method to create a microsphere based structure that mimics the light scattering properties of a random structural pattern comprising the steps of: infiltrating a structure with a polymer to create a microsphere-polymer composite; removing the microspheres to create a polymer structure; applying stress to the polymer structure; infiltrating the polymer structure with a material that is different than the polymer; and removing the polymer.

In other aspects, the present invention provides a method of fabrication wherein the microspheres are removed by etching.

In other aspects, the present invention provides a method of fabrication wherein stress is applied by mechanically manipulating the polymer structure.

In other aspects, the present invention provides a method of fabrication wherein the infiltrated material is $SiO_2$.

In other aspects, the present invention provides a method of fabrication wherein the infiltrating of the polymer structure is done by a Sol-Gel process.

In other aspects, the present invention provides a method of fabrication wherein the polymer is removed during sintering.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

FIG. 5A is a 2D image of randomly positioned monodisperse microspheres (f=0.45) from Monte-Carlo simulation.

FIG. 5B is the 2D autocorrelation function obtained from the image.

FIG. 5C is the 1D autocorrelation function obtained by circularly averaging (b).

FIG. 13A is an SEM image of silica microspheres deposited by spray coating when the surfactant concentration is 0%.

FIG. 13B is an SEM image of silica microspheres deposited by spray coating when the surfactant concentration is $2 \times 10^{-4}$%.

FIG. 13C is an SEM image of silica microspheres deposited by spray coating when the surfactant concentration is $2 \times 10^{-3}$%. (d) I* spectrum for the 3 cases.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

Radiative Cooling

Heat radiated by a terrestrial object in a select mid-infrared (IR) spectral range, which is known as the atmospheric transparency window, can transmit through the atmosphere into outer space. When this radiative heat loss is greater than the heat gain from ambient sources, the object cools below the ambient temperature until it reaches a steady-state temperature where the net heat transfer rate is zero. This effect can reduce the temperature of an object by ~40° C. below the ambient temperature at night. Other work has demonstrated radiative cooling of an object by 5° C. below the ambient temperature under the direct sunlight.

Figure 1A:
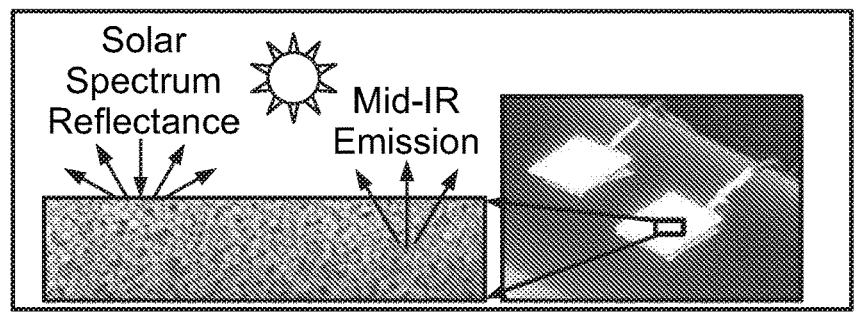
FIG. 1A is a conceptual description of passive cooling.

FIG. 1A conceptually describes the idea of passive cooling. What appears as a coating consists of randomly packed microspheres. These microspheres can be solid or hollow. The solar radiation is scattered from the microsphere coating without being absorbed, while the heat escapes from the surface by mid-IR emission. Through this mechanism, the coated object can be effectively cooled below the ambient temperature.

Figure 1B:
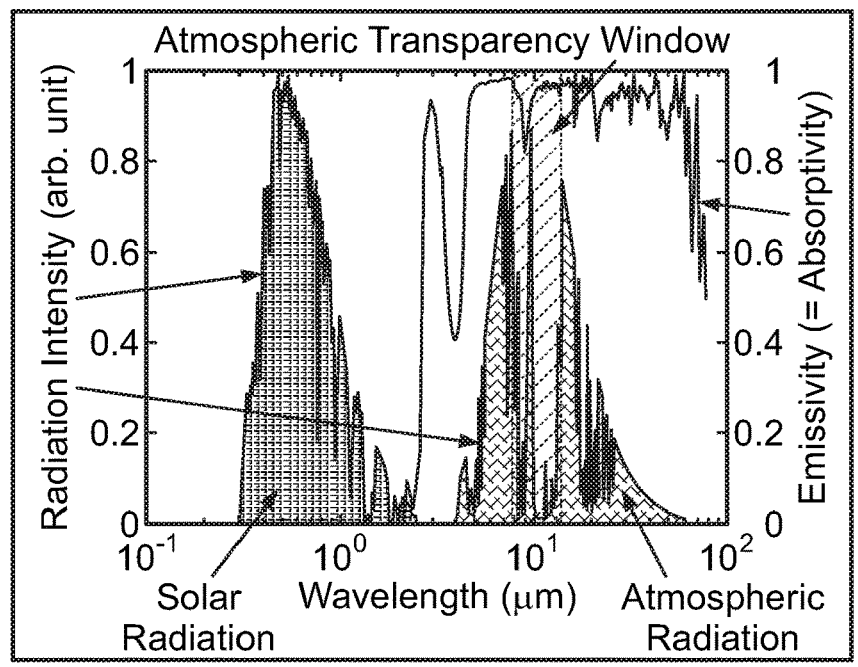
FIG. 1B shows an experimentally determined emissivity spectrum of an embodiment of the present using randomly packed $SiO_2$ microspheres against solar and atmospheric radiation intensity.

The graph in FIG. 1B shows the emissivity from a coating of the present invention against solar and atmospheric radiation intensity. The emissivity (=absorptivity) of the sample is almost negligible in the solar radiation spectral range (0.3-3 μm), whereas the emissivity is high in the atmospheric transparency window (8-13 μm). The overall average IR emissivity of this particular coating over the atmospheric transparency window was 0.94.

For high emissivity in the mid-IR, many polar materials can be used such as $SiO_2$, SiO, SiC, $TiO_2$, $HfO_2$, $Al_2O_3$, ZnO, etc. These materials exhibit resonances in the mid-IR due to phonon-polariton excitations. The resonances are manifest as a strong dispersion in the dielectric function. This dispersion typically involves many absorption peaks in the mid-IR spectrum. For effective cooling, the average absorption over the atmospheric transparency window should be maximized. A goal of the present invention is to enhance the average absorption using microsphere-based structures.

In the mid-IR, the photon wavelength (~10 μm) is much greater than the size of the microspheres (<<10 μm). In this case, mid-IR light does not "see" the detailed structures and responds roughly to an average of the dielectric function. Based on the effective medium theory, which finds the average dielectric function, emissivity increases as the fill fraction of the microspheres decreases.

Figure 2:
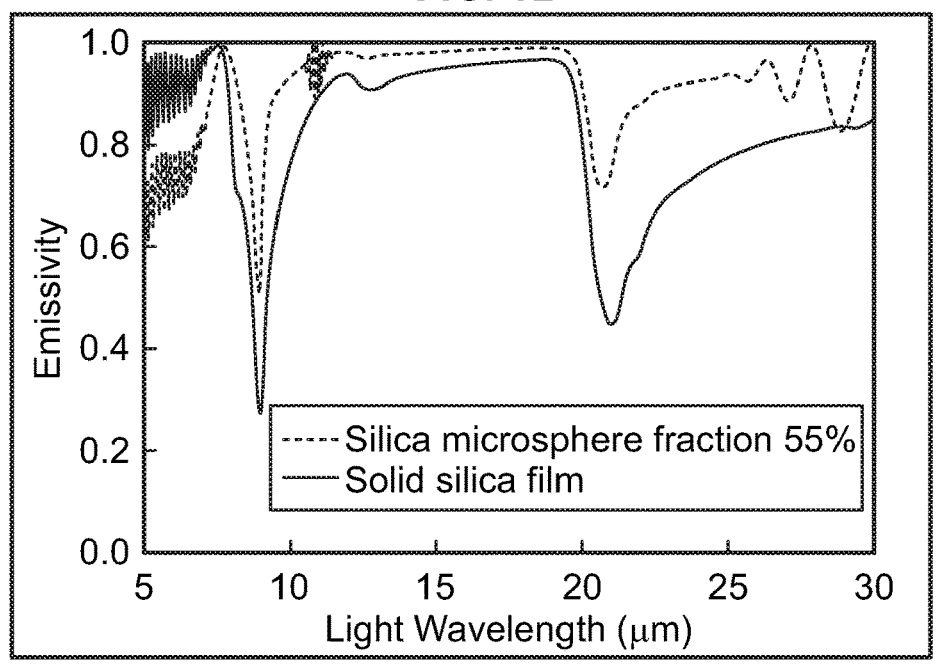
FIG. 2 shows the Mid-IR emissivity spectrum of solid silica film and silica microsphere packing with 55% fill fraction. The thickness of both films is 100 μm, and normal direction of emission is considered.

For example, FIG. 2 compares the calculated mid-IR emissivity spectrum of a solid $SiO_2$ film and a film of $SiO_2$ microspheres of 55% fill fraction. The calculation is based on Maxwell-Garnett effective medium theory, and the films are 100-μm-thick. The $SiO_2$ f410 microsphere film show high emissivity in the mid-IR and the emissivity is greater than the solid $SiO_2$ film. That is, the emissivity can be enhanced above the bulk material value. The above computational results predict that the cooling power can be enhanced by decreasing the microsphere fill fraction in the structures.

Optical Scattering in Random Media

In random media consisting of non-absorbing materials, light is scattered in random directions. The random scattering resembles diffusive transport of particles in many aspects. In the diffusion model of light propagation, the energy packets of light random-walk through the scattering media due to irregular structures. An important optical parameter is the transport mean free path of photons, $l^*$, which is defined as the average distance that an energy packet travels before its propagation direction has no correlation with its original direction. The transport mean free path is to be distinguished from the scattering mean free path, $l$, which is the average distance over which light propagates without scattering. In general, $l^*$ is larger than $l$, but their values can become close as the scattering strength of a constituent particle increases. While the diffusion model considers the transport of energy packets only, the wave nature of light such as interference is still preserved in random media. For example, backscattered light near the surface normal direction always interferes constructively, and light can be localized in strongly scattering media due to interference, a phenomenon known as Anderson localization.

In one aspect of the invention, material systems are configured such that $kl<<1$, where $k=2\pi n/\lambda$ is the wavevector, $\lambda$ is the wavelength of light in free space, and $n$ is the effective refractive index of the random media. In this case, Anderson localization does not occur. Thus, the light transport in the material systems can be effectively described by the diffusion model.

When the film thickness of random media is much larger than $l^*$, the transmittance (T) is related to $l^*$ by $$T \cong \frac{1+z_e}{L/l^* + 2z_e}, \quad (1)$$

where $z_e$ is the extrapolation length normalized by $l^*$, and the extrapolation length is the distance outside the slab over which the diffuse intensity vanishes. When the internal reflectance at the boundaries is R, the extrapolation length ratio is given by $$z_e = \frac{2}{3}\frac{1+R}{1-R}. \quad (2)$$

Equation (1) shows that, roughly, transmittance in a thick slab is inversely proportional to the thickness. To estimate $z_e$, Maxwell-Garnett effective medium approximation for the randomly packed $SiO_2$ microspheres may be applied. Using the refractive index of $SiO_2$ (n=1.46) and the fill fraction (f~0.6), $z_e$ may be estimated to be approximately 1.4. Note that T and $l^*$ are functions of wavelength. To experimentally determine $l^*$, T may be measured for various thicknesses L. Then, 1/T vs. L at each wavelength is plotted, and apply linear regression to estimate the slope $1/[l^*(1+s)]$. The slope yields $l^*$ as a function of wavelength.

Figure 3A:
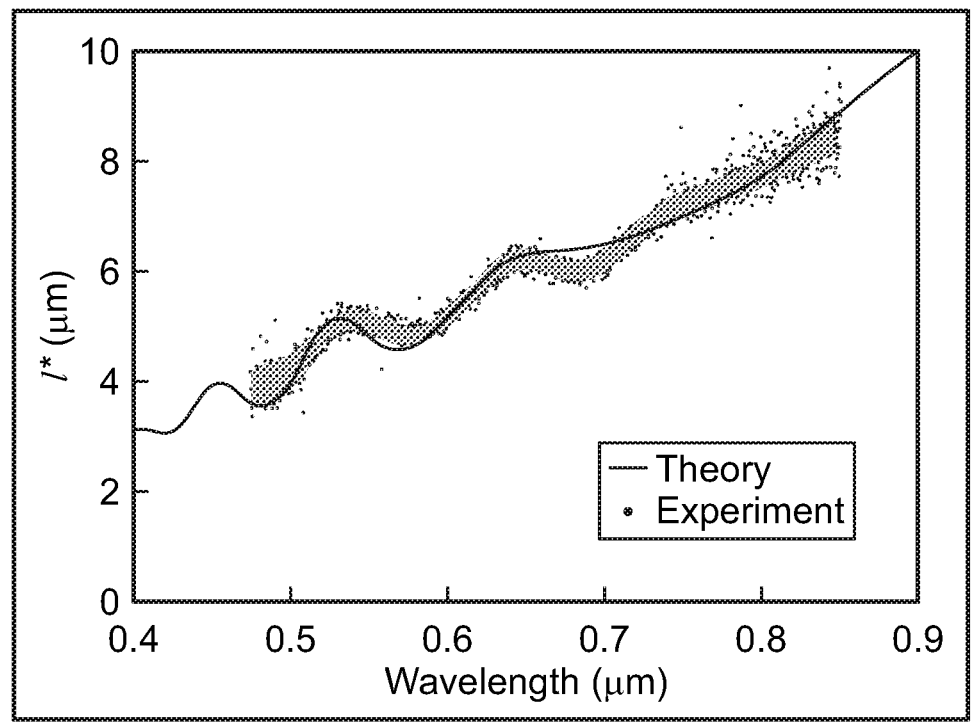
FIG. 3A is a comparison of experimentally measured and theoretically predicted I* for randomly packed solid silica microspheres.
Figure 3B:
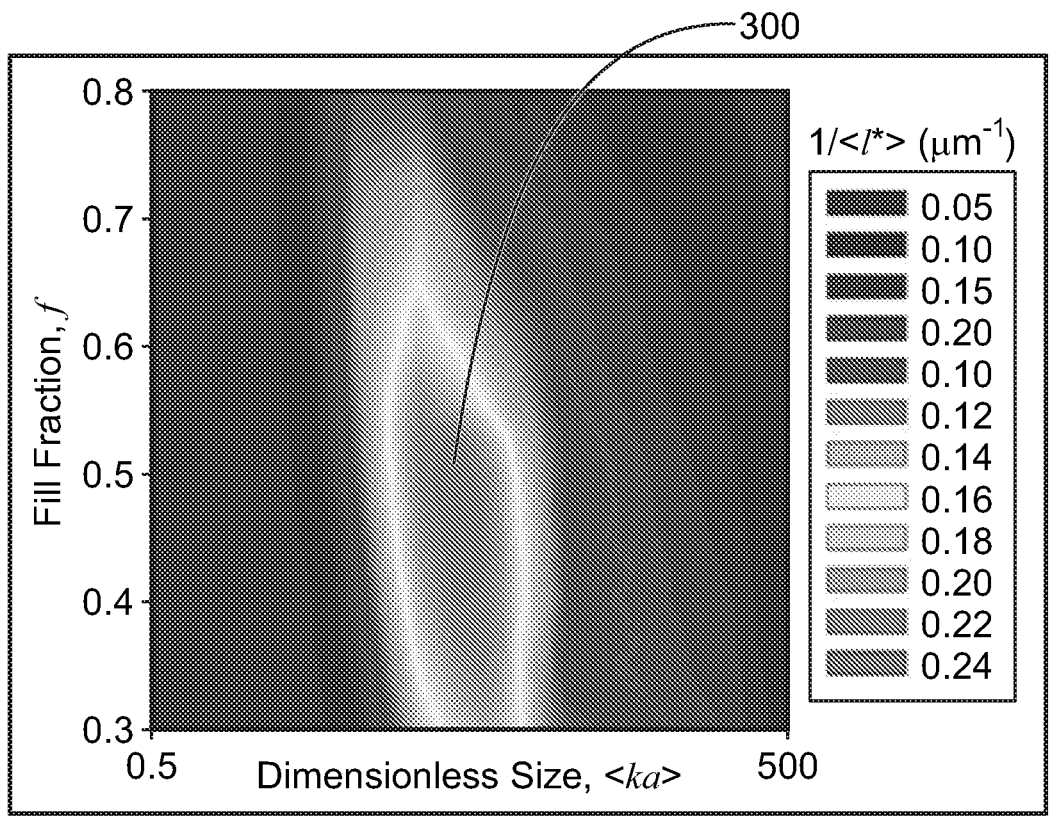
FIG. 3B shows the dependence of the sunlight scattering power, $1/<I^*>$, on the characteristic dimensionless size and fill fraction of randomly packed hollow microspheres surrounded by silica.

FIG. 3A shows both experimentally measured and theoretically calculated $l^*$ as a function of wavelength. The mean field theory with a proper correction made to the asymmetry cross-section may be applied. A correction to the original theory allows accurately predicting experimentally measured $l^*$. Note that the resonant response in $l^*$, which shows up as peaks and valleys in FIG. 3A is correctly captured. With the verified theoretical model, the sunlight scattering power, $1/<l^*>$ may be calculated as a function of characteristic dimensionless microsphere size, $<ka>$ and fill fraction, f [see FIG. 3B]. Here, $<>$ represents the average value with the solar intensity spectrum as a weighting factor. FIG. 3B shows that the scattering power can maximize (region 300) with a judicious choice on microsphere material (therefore refractive index), size, and fill fraction.

Cooling Performance

Figure 4A:
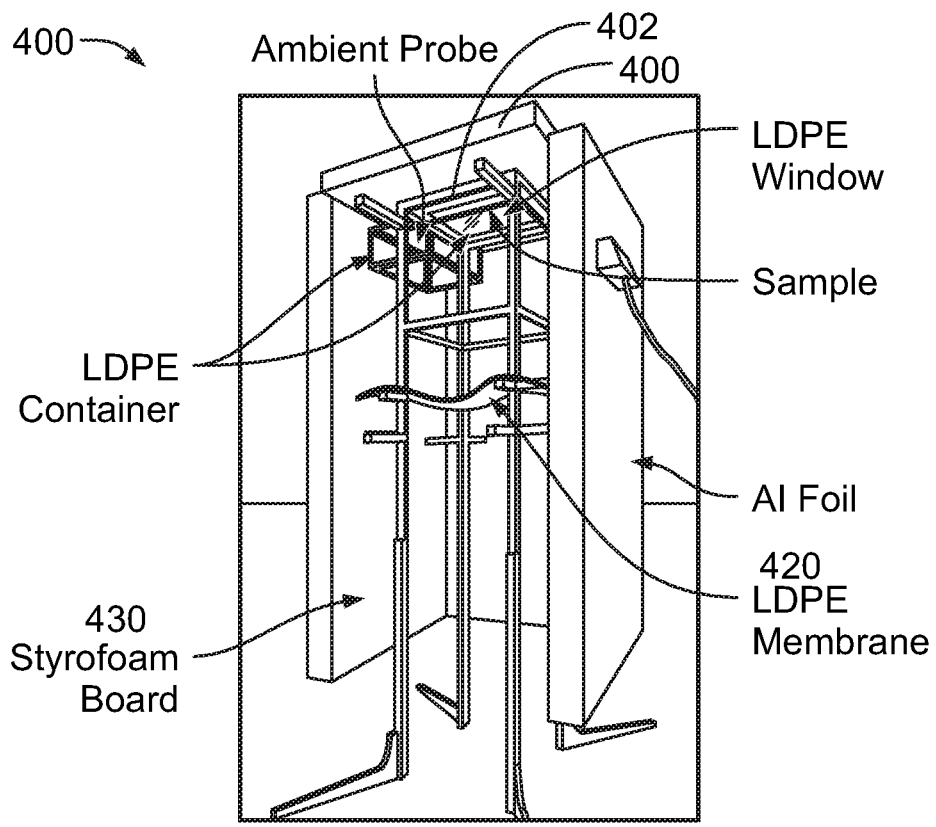
FIG. 4A shows an outdoor experimental setup for temperature measurement for an embodiment of the present invention.
Figure 4B:
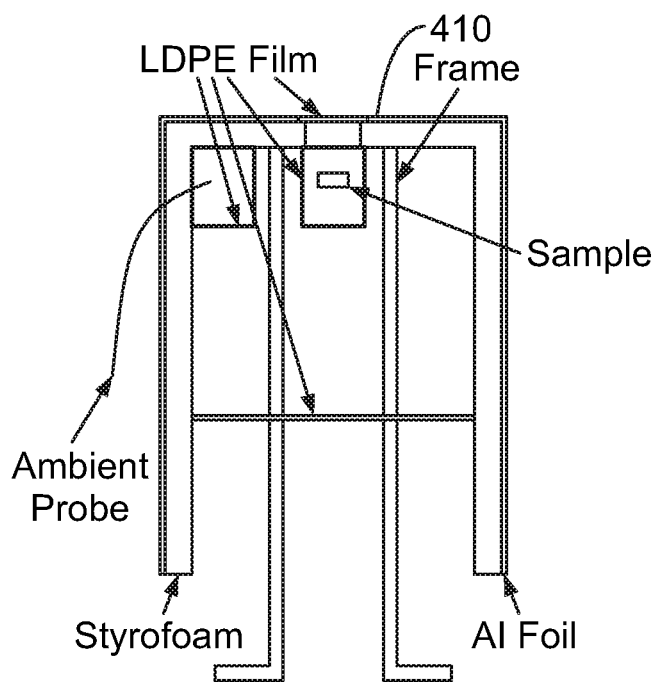
FIG. 4B is a schematic diagram of an outdoor experimental setup for temperature measurement for an embodiment of the present invention.

To gauge the cooling performance of coatings of the present invention under the sunlight, the experimental fixtures 400 and 410, as shown in FIGS. 4A and 4B, were used. These fixtures are designed to accurately measure the temperature of the air surrounding the samples so that the sample temperatures can be properly compared to the ambient air temperature. Typically, the ambient temperature is measured in a Stevenson screen constructed from a white box with slits on its side walls to allow air flow. The white surface minimizes the solar heating of the box. The inside of the box is dark enough to prevent radiative heating of a thermometer in the box. The thermometer is located about 1-2 m above the ground. The fixtures resemble a Stevenson screen, but significant modifications are made to enable the temperature measurement of samples that are exposed to the sunlight. The box has a small window 402 at the top to expose the sample to sunlight, and the bottom wall of the box is replaced by a low-density polyethylene (LDPE) film 420 mto eliminate the wall heating by the sunlight coming through the top window. In addition, the slits on the side walls are eliminated to reduce the convective air flow from the outside and the subsequent fluctuations in the inside temperature. Walls 430 are made of Styrofoam covered with aluminum sheets. With this design, the ambient temperature represents the temperature of the air surrounding the sample.

Microspheres were deposited on a glass slide, and black paint applied on the opposite side of the glass slide. For comparison, a sample coated with commercial solar-reflective white paint (Chromaflo Technologies, Spartacryl PM 60312) was prepared which has been shown that this paint achieves the lowest temperature under the sunlight among several different brands.

Figure 4C:
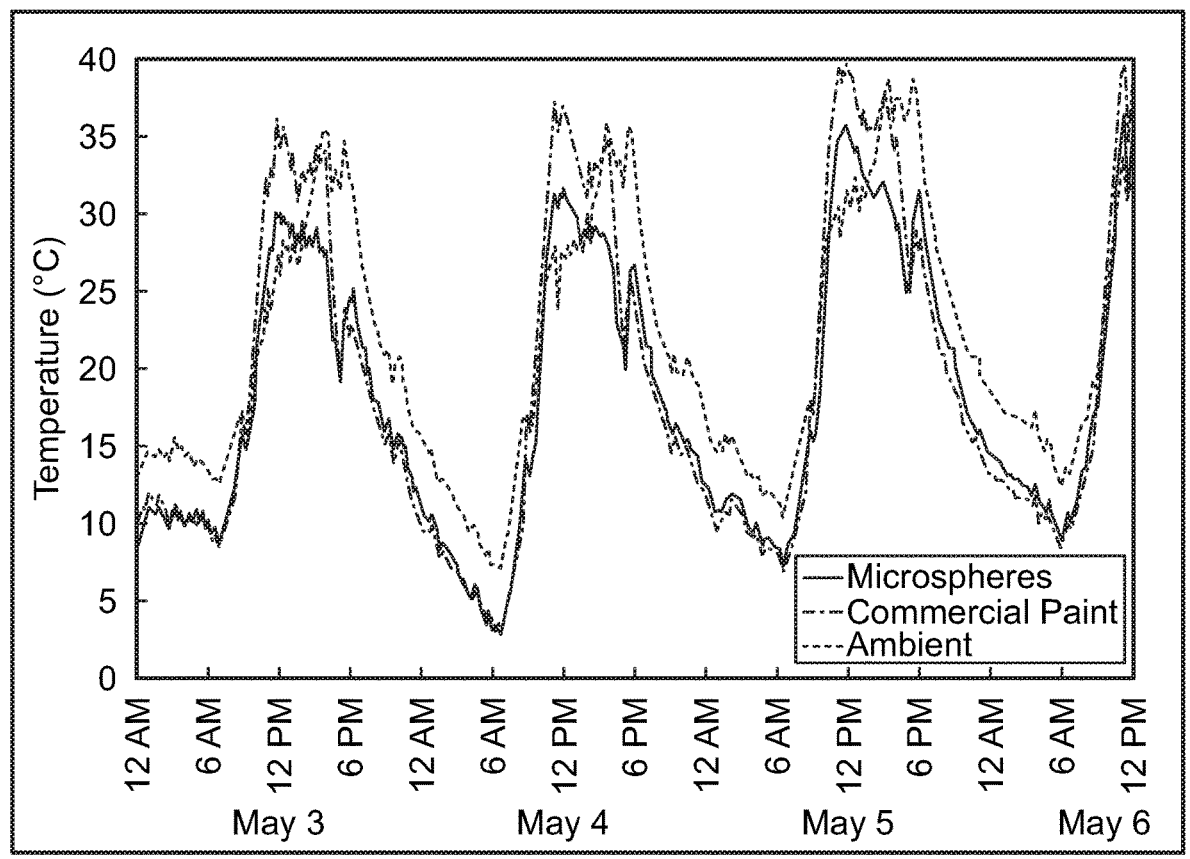
FIG. 4C shows temperature variation over 3.5 days for a microsphere coating for an embodiment of the present invention, commercial solar-rejection white paint, and ambient air.

Using the setup, the temperature of the two samples and the ambient air in Albuquerque, New Mexico was measured over 3.5 days when the sky is relatively clear. The results [FIG. 4C] show that the microsphere-based coating of the present invention on a black substrate can reduce the substrate temperature below that of the ambient air by as much as 12° C. under the sunlight. The coating also outperforms the commercial solar-reflective white paint during the daytime. At its peak performance, our coating achieves a substrate temperature 7° C. below that of the commercial paint. The average temperature of the substrate under the coating of the present invention is 4.7° C. below that of the substrate coated with the commercial paint during the period of strongest sunlight radiation (between 11 am and 4 pm). During this strongest radiation period, the temperature of the substrates coated with $SiO_2$ microspheres and commercial paint both can rise above that of the ambient, after which the ambient temperature rises with a time lag. The reason is that the solid coatings heat up faster than the ambient air under solar radiation. After reaching the maximum temperature, the coatings are cooled relatively slowly as long as the sun's altitude is high. At night, the coating of the present invention and the commercial paint both achieve ~4° C. below the ambient temperature. Note that, contrary to previous studies, the remarkable cooling effects of the present invention have been achieved on a black substrate without using precious metals, such as silver, as a solar reflector.

In other embodiments, the present invention enhances the light scattering from the thinnest possible coatings to achieve effective radiative cooling.

Characterization of Randomness

The structure of amorphous solids and liquids is characterized by the so-called radial distribution function. Because the coatings of the present invention have randomly positioned microspheres like atoms in amorphous solids, the structure of the coatings of the present invention may be characterized by the radial distribution function. Consider a random medium of a volume V within which a microsphere is at the origin of r. The radial distribution function g(r) of the medium is defined such that g(r) dr/V is the probability of finding another microsphere in dr. The radial distribution function is related to the structure factor, which determines how the random medium scatters light. The relationship between the two is given by $$S(q)=1+\rho\int_v[g(r)-1]e^{-iq\cdot r}dr, \quad (3)$$

where S is the structure factor, q is the spatial frequency, and $\rho$ is the number density. Because of the simple Fourier transform relationship, the radial distribution function for amorphous solids is typically obtained from X-ray scattering or neutron scattering.

For the analysis of atomic structures, the electron distribution within an atom is assumed to be spherically symmetric about the origin. In this case, the atomic form factor, which affects the structure factor, is obtained as a simple function. However, for the microsphere-based random media of the present invention, an analogy to the atomic case is not possible and obtaining a structure factor by optical scattering measurement is nontrivial. Thus, the radial distribution function for the random media has been typically obtained from the measurement of the location of each microsphere. The microsphere locations are determined from a 3D construction from confocal microscopy images taken at many different depth levels. This procedure is highly complicated and time-consuming. Moreover, the resolution of confocal microscopy is typically larger than ~200 nm. When the microsphere size is not very large compared to the resolution, an accurate reconstruction of the real structure from optical sectioning is difficult. Thus, a full study to establish a structure-property relationship in random media has been limited by the lack of practically convenient methods to obtain the radial distribution function.

To overcome this difficulty in characterizing randomness, the present invention implements a method which can be used to obtain the structure factor directly from 2D images. The method relates the radial distribution function to the autocorrelation function of 2D images. Consider a 2D image of 512×512 pixels taken from the random arrangement of microspheres with a fill fraction of f=0.45. The intensities of I=0 and 1 are assigned to microspheres and surrounding medium, respectively, in the image. Such an image may be created from Monte-Carlo simulation, as shown in FIG. 5A. From such images, an autocorrelation function $C_I$ for the intensity can be obtained. The autocorrelation function is defined as $$C_I(r) = \frac{\int I(r')I(r'-r)dr'}{\int I^2(r')dr'}. \quad (4)$$

Because of the isotropic random nature of the microsphere arrangement, the autocorrelation function possesses circular symmetry, as shown in FIG. 5B. The strong spike at the center and the circular symmetry are a clear signature of the random arrangement of microspheres. A circular average of the autocorrelation function is shown in FIG. 5C as a function of the distance normalized by the microsphere diameter 2R. The microsphere correlation in position decays fast over a distance of ~2R. As the distance increases further, the autocorrelation shows an oscillating feature that falls off slowly. The peaks of the oscillation are due to the short-range correlations induced by the non-zero microsphere size. These peaks are located when r/(2R) is slightly larger than positive integers because the fill fraction of the microspheres (f=0.45) is less than that of the close random packing (f=0.64). When the distance is much larger than 2R, the autocorrelation function approaches a constant value of f=0.45.

The autocorrelation function can be expressed in terms of the radial distribution function as $$C_I(r) = \frac{1}{\pi R^2}\left[\{1 - u(r - 2R)\}\Psi(r) + \int_0^{2R}\int_0^{2\pi}\frac{f}{\pi R^2}g\left(\sqrt{r^2 + \rho^2 + 2r\rho\cos\alpha}\right)\Psi(\rho)\rho\,d\alpha\,d\rho\right], \quad (5)$$

To where u is the Heaviside step function $\Psi(\rho)=2R^2\theta-\rho R \sin\theta$ with $\theta=\cos^{-1}(\rho/2R)$.

Figure 6:
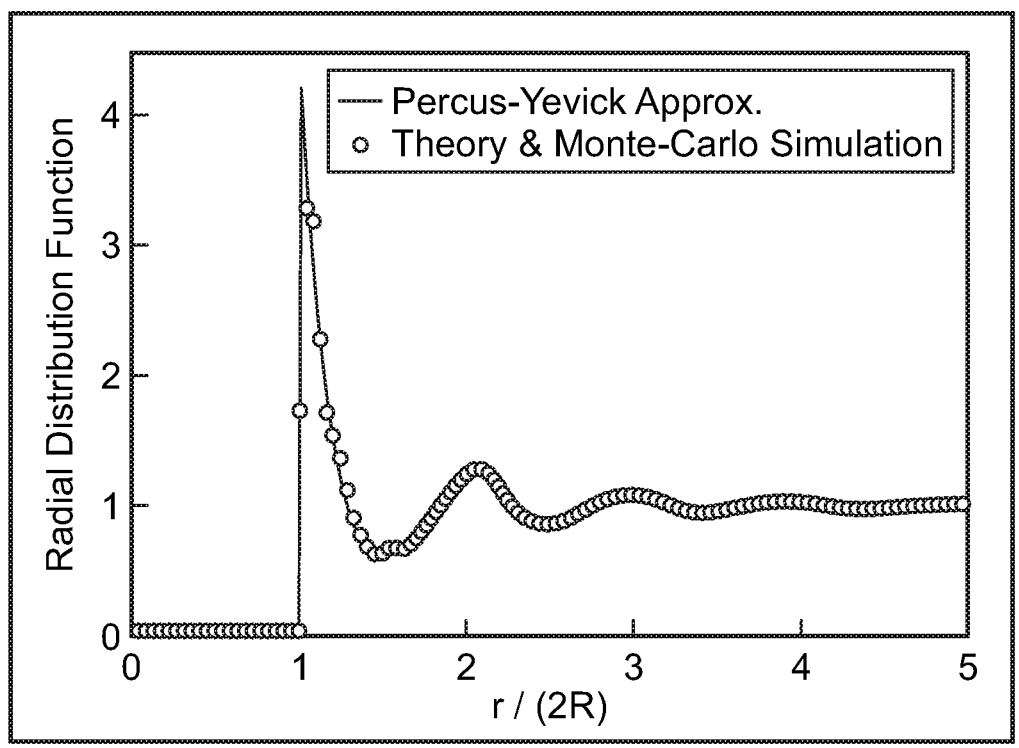
FIG. 6 is a comparison of radial distribution functions between the teachings of the present invention and Percus-Yevick approximation.

Once the autocorrelation function $C_1$ is given, as in FIG. 5C, the radial distribution function g(r) may be obtained by solving Eq. (5). Unfortunately, the discretization of Eq. (5) yields a highly singular matrix, and numerical solutions are difficult to obtain. However, the numerical difficulties may be circumvented by performing Laplace transform on Eq. (5). FIG. 6 shows the radial distribution function by solving Eq. (5) with FIG. 5C as an input. For a random arrangement of monodisperse microspheres, the Percus-Yevick approximation provides an analytical expression for the radial distribution function. This approximation allows an exact solution for the radial distribution function, which is displayed in FIG. 6 for comparison. The almost perfect match between the teachings of the present invention with Monte-Carlo simulation and the Percus-Yevick approximation provides validation. The structure factor is easily calculated from the radial distribution function using Eq. (3).

Mimicking the Structure Factor S(q) of White Beetle Scales

Figure 7:
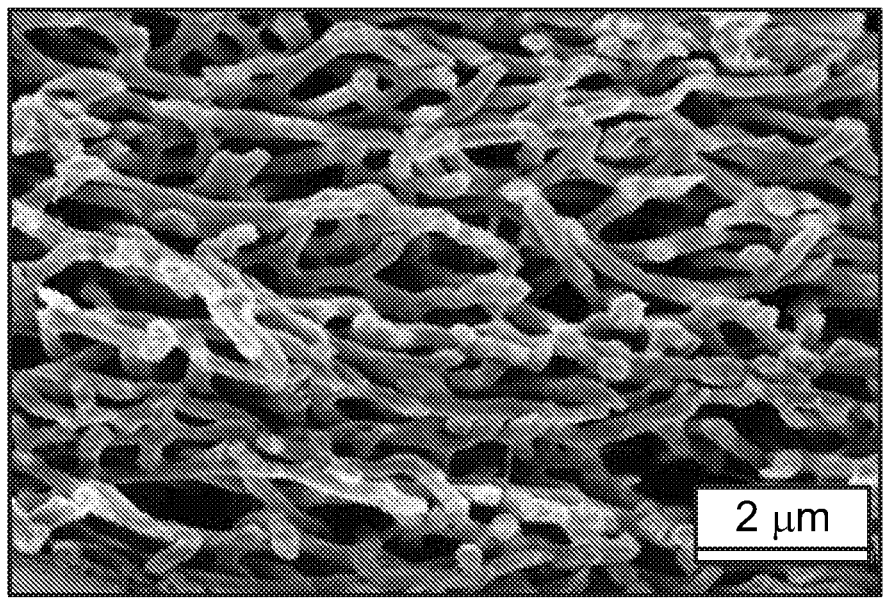
FIG. 7 is a scanning electron micrograph of white beetle scale.

In one embodiment, the present invention provides extremely thin white films that are advantageous for use with and in applications such as defense-relevant situations, such as space vehicles, satellites, ships, and buildings. White beetles provide a clue in achieving such films, not by refractive index contrasts, but by structural ingenuity. The white beetle scales consist of an anisotropic random network of chitin, a polymer of N-acetylglucosamine (see FIG. 7). The strong diffuse scattering of light is achieved by the random nature of the fibrillar structures. The white beetle scales are found to have a photon transport mean free path of merely 1-2 μm, and this is the lowest among known materials of low refractive index (~1.5).

Because of such short mean free path in white beetle scales, the beetles appear bright white from only 5-15 μm thick scales. It is not currently fully understood how the chitin structures achieve such strong optical scattering. In particular, the effect of anisotropy on light scattering is much debated.

Optical scattering has been studied by fabricating random media that consist of particles of various refractive index materials including semiconductors, polystyrene, and titanium dioxide. Interestingly, a different morphology—random network of pores in GaP—was able to achieve one of the highest light scattering efficiencies reported to date for wavelengths longer than 550 nm. While the GaP structure shares some common features with the white beetle scales, such as random networks and a high fill fraction of ~0.5, the two structures are quite different from each other in visual appearance revealed by scanning electron micrographs. Specifically, the synthetic GaP structure is a network of isotropically distributed pores rather than an anisotropic network of fibrillar material. More critically, GaP suffers from absorption for wavelengths shorter than 550 nm and cannot achieve a white surface. These observations raise key scientific questions. What is so unique about the random fibrillar structure that leads to one of the shortest photon transport mean free path?

While previously published experimental studies have increased the understanding of light scattering in random media, the strong light scattering observed in nature (e.g., white beetles) remains unexplained. A method that may be used to replicate nature, includes using artificial photonic random media from $SiO_2$ microspheres. Structures may be constructed by using fabrication methods that can control structural parameters, such as diameter, anisotropy, and fill fraction. The goal is to achieve a structure factor similar to that of white beetle scales.

The fibrillar network structure in white beetle scales (FIG. 7) is very intricate. For example, the branches on a fibril have random locations and lengths, and it would be difficult to replicate the real space geometry of the microstructure. However, different geometries that yield the same structure factor as that of white beetles can be conceived.

To determine the structure factor, in one embodiment, the present provides a method that comprises the steps of first infiltrating white beetle scales with a polymer to provide flat top and bottom surfaces. The top flat surface will then be gradually polished and intermittently imaged by scanning electron microscopy (SEM). For the SEM images, the method assigns intensities 1 and 0 for the fibrils and polymer, respectively. If the image contrast between the two regions is not enough, the method will etch out the fibrils. From the intensity distribution, the method finds an autocorrelation function of the intensities. Solving Eq. (5) with the autocorrelation function as an input, the method obtains the radial distribution function. Strictly speaking, the radial distribution function is defined only for isotropic random structures, to which white beetle scales do not belong. Thus, the obtained autocorrelation function will be anisotropic. The method determines the three principal directions of the anisotropic autocorrelation function. In this case, r in Eqs. (4) and (5) is the distance in a specific direction. Then, the method determines the radial distribution function in the three principal directions.

Figure 8A:
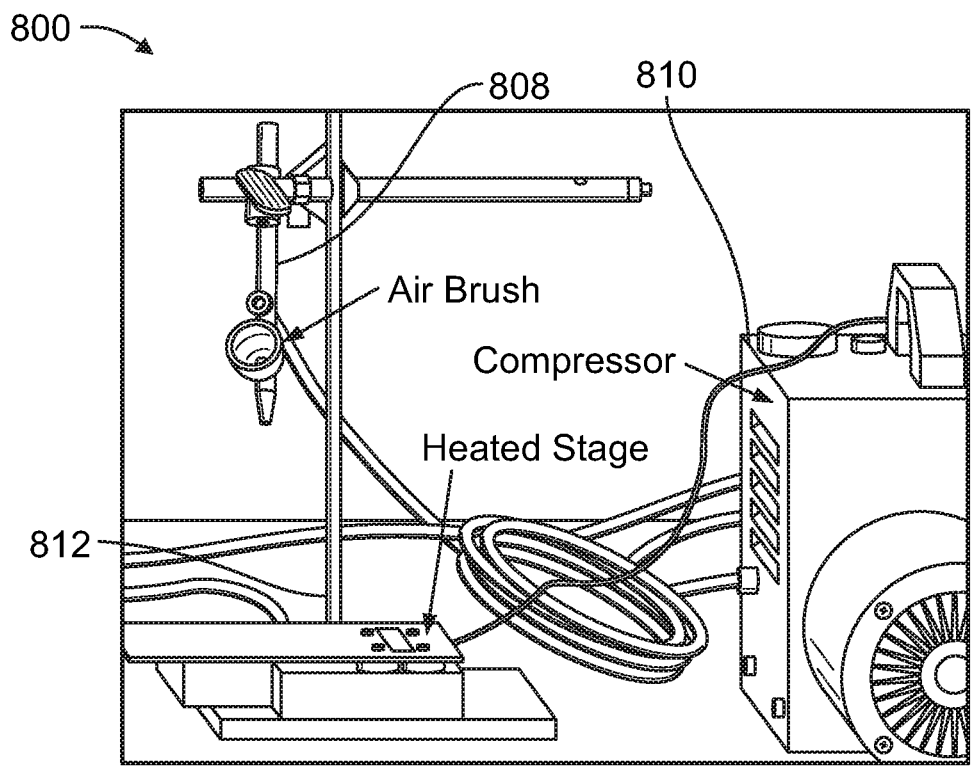
FIG. 8A shows the complete assembly of spray-coating apparatus for use with an embodiment of the present invention.
Figure 8B:
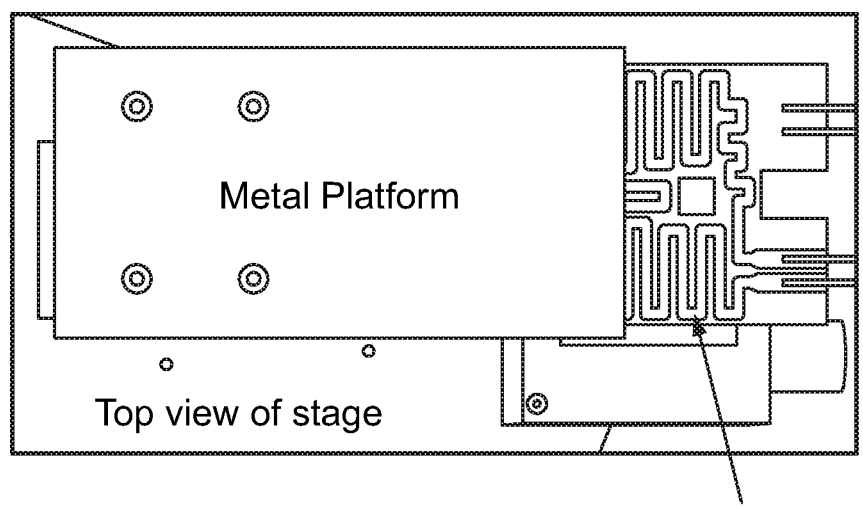
FIG. 8B is a top view of a heated stage where the substrate can be placed on the metal platform for an embodiment of the present invention.
Figure 8C:
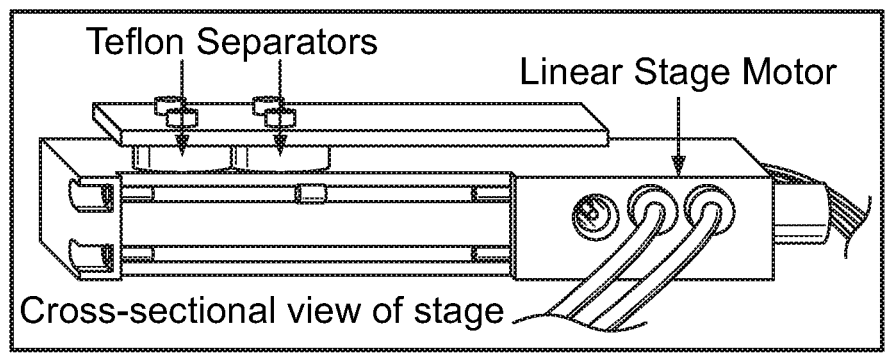
FIG. 8C is a cross-sectional view of the heated, movable stage showing the linear motor.
Figure 8D:
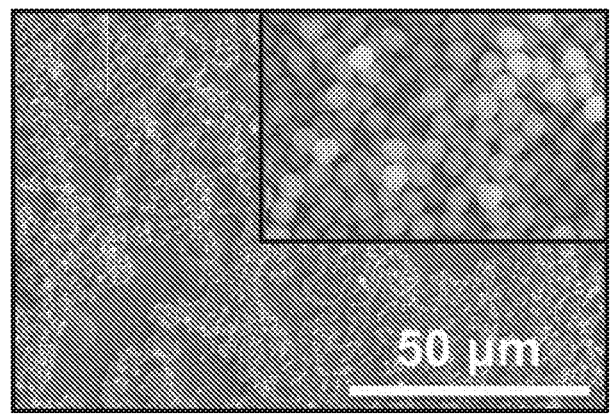
FIG. 8D is an SEM image of a microsphere coating with 1 stage cycle.
Figure 8E:
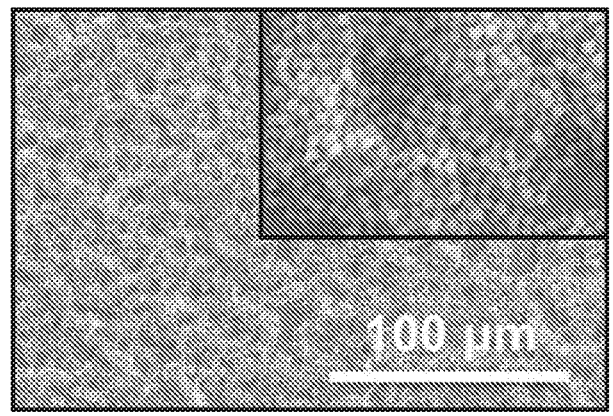
FIG. 8E is an SEM image of a microsphere coating with 3 stage cycles.

To fabricate microsphere-based structures that mimic the radial distribution function, in another method of the present invention, the method prepares samples of randomly packed microspheres by colloidal sedimentation and by spray coating. In colloidal sedimentation, the method may add an electrolyte to a stable colloidal suspension of $SiO_2$ microspheres. Specifically, 0.01 M of KCl may be added to an aqueous microsphere solution. The salt addition induces colloidal instability, and the flocculated microspheres precipitate onto a substrate as a randomly packed film. For spray coating, 2 vol % aqueous solution of microspheres is ejected through an air-brush nozzle (Badger 100G, Badger Air-Brush) at ~70 kPa. The nozzle is located ~25 cm above the substrate. The substrate is subjected to a linear periodic motion to ensure coating uniformity and is heated at ~130° C. to evaporate water quickly before microspheres are significantly rearranged. FIG. 8A shows an apparatus 800 consisting of a gravity-fed airbrush 808, an air compressor 810 (Badger, TC910 Aspire Pro), and a custom-built, linear-motion, heated stage 812.

For the colloidal deposition method, a critical parameter to control the fill fraction f of microspheres in the deposited film is the salt concentration. As the salt concentration increases, the microsphere fill fraction decreases and reaches a plateau at f ~0.55 at high enough concentrations. The spray deposition is more flexible to control than the colloidal sedimentation. The spray process involves a number of parameters such as stage/scan speed, distance of airbrush from the substrate, flow rate, nozzle outlet pressure, and substrate temperature. Substrate temperature is important to the drying dynamics of droplets, in which higher substrate temperatures allow for faster drying of the droplets and prevent coalescence into larger droplet before drying.

Figure 9A:
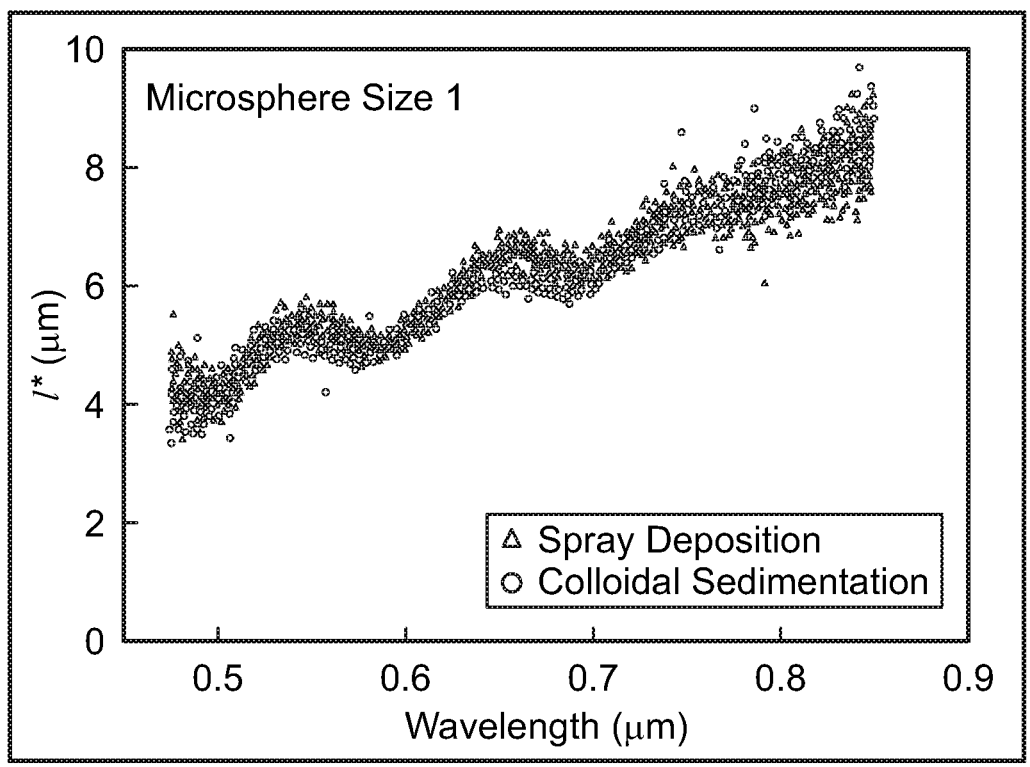
FIGS. 9A and 9B show the experimentally determined I* for two different microsphere sizes. The I* values for samples prepared by colloidal sedimentation and spray deposition is compared.
Figure 9B:
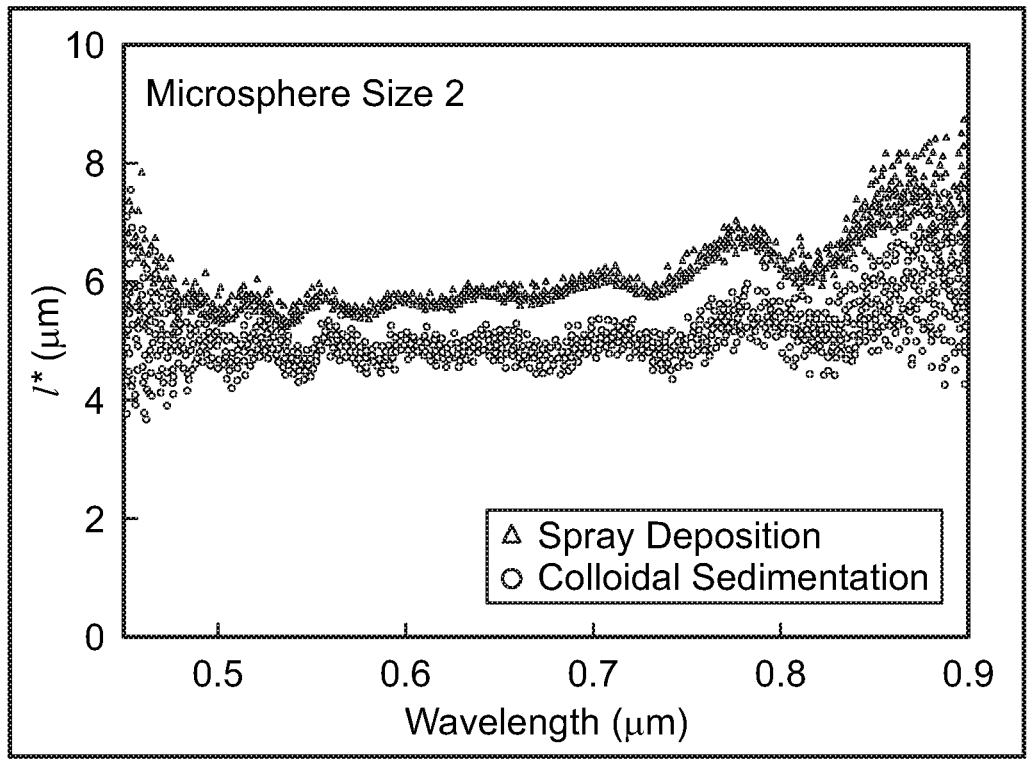

FIG. 9 compares a measured l* on samples prepared by colloidal sedimentation and spray deposition. For the l* measurement, Eq. (1) is used. Depending on the microsphere size, the discrepancy in l* values for the two deposition methods can be slightly different. However, in general, both methods give quite a random arrangement of microspheres when the deposition parameters are optimized.

To obtain the structure factor of the microsphere-based random media, the present invention in one embodiment uses the same technique as for white beetle scales. In brief, the method will infiltrate the structure with a polymer, polish the composite in a layer-by-layer fashion, intermittently capture SEM images, and find the radial distribution function from the SEM images. Note that the range of fill fraction of fibrils in white beetle scales is 0.5-0.61. This range of fill fraction is similar to that of randomly packed monodisperse microspheres, which is from 0.55 (random loose packing) to 0.64 (random close packing). Thus, the fill fraction may be controlled by microsphere deposition to be the same as that of white beetles. This will allow the embodiment to have the same plateau value of the autocorrelation functions at large r [see FIG. 5C] because the plateau value is equal to the fill fraction.

FIGS. 10A-10F illustrate a process flow to fabricate anisotropic microsphere-based structures that mimic the structure factor of white beetle scales. Microspheres, such as $SiO_2$ microspheres, may be deposited onto a substrate by colloidal sedimentation or by spray deposition [FIG. 10A]. The resulting $SiO_2$ structure will be infiltrated with a polymer [FIG. 10B] under vacuum. The residual polymer, after full infiltration, leaves a thin solid film on top of the microsphere structures. This excess polymer can be easily polished, which allows HF to penetrate into the composite film at a later etching step [FIG. 10C] The $SiO_2$-polymer composite film is delaminated from the substrate, and the $SiO_2$ microspheres can be removed by etching in an HF solution [FIG. 10C].

Figure 11:
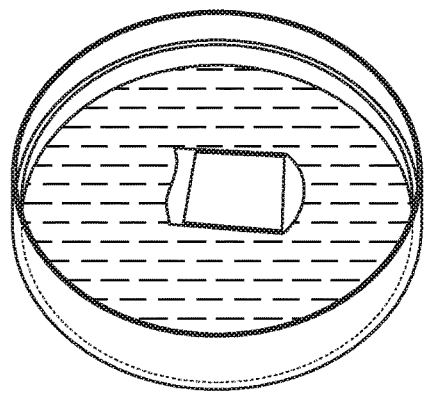
FIG. 11 shows an embodiment of the present invention providing a porous polymer film that corresponds to FIG. 10C.

FIG. 11 shows a porous polymer film that was created using the embodiments of the present invention. Because the microsphere-based samples are isotropic after colloidal and spray deposition, we will make the porous polymeric medium anisotropic by straining the film [FIG. 10D]. The strain may be adjusted to set the desired level of anisotropy in the material. While the porous polymer film is under strain, the pores may be infiltrated with a $SiO_2$ precursor, tetraethyl orthosilicate (TEOS), and turned into a gel by hydrolysis [FIG. 10E]. The polymer will then be removed, and the gel will be converted to glass $SiO_2$ by sintering [FIG. 10F].

Figure 10A:
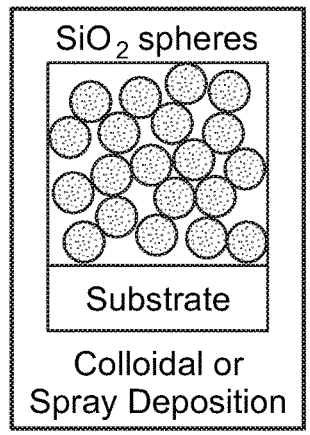
FIGS. 10A, 10B, 10C, 10D, 10E and 10F show a fabrication process for anisotropic $SiO_2$ media for an embodiment of the present invention that possesses the same structure factor S(q) as that of white beetle scales.
Figure 10B:
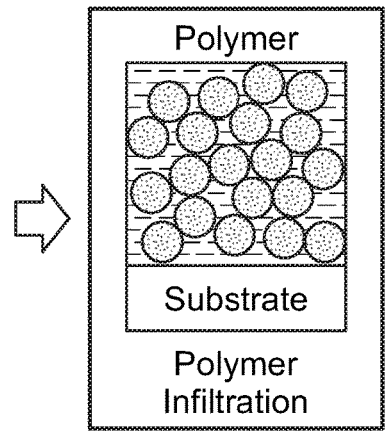
Figure 10C:
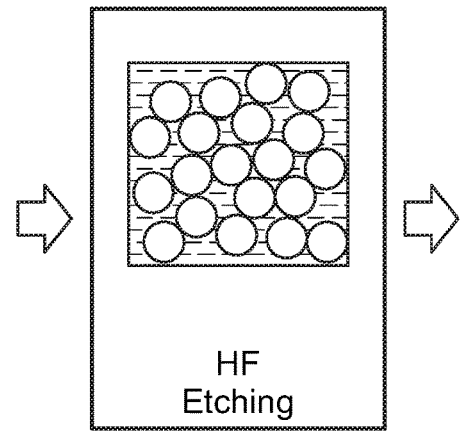
Figure 10D:
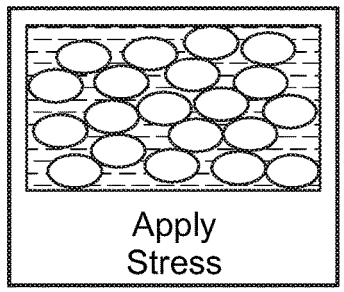
Figure 10E:
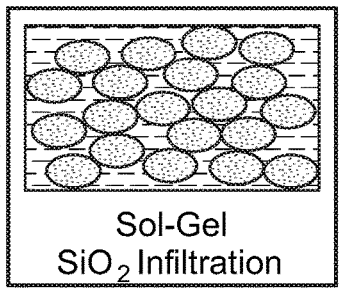
Figure 10F:
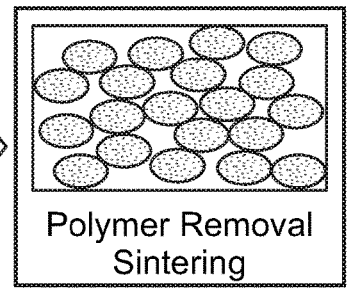

To obtain the anisotropic radial distribution function of the final structures, the present invention, in another embodiment, mayl follow steps similar to obtaining the structure factor for the beetle scales. The embodiment first infiltrates a $SiO_2$ network with a polymer to create a flat top and bottom surfaces. The top flat surface will then be gradually polished and intermittently imaged by SEM. The anisotropic radial distribution function calculated from SEM images will be compared to that of white beetle scales. Controlling the strain on the polymer media will achieve an anisotropic radial distribution function close to that of white beetle scales. During the process shown in FIGS. 10A-10F, the fill fraction in the final structure [FIG. 10F] should be similar to that of the original $SiO_2$ microspheres [FIG. 10A]. Since the volume occupied by the sol shrinks during the sol-gel and sintering steps, techniques known to those of ordinary skill in the art may be used to increase the fill fraction of $SiO_2$ microspheres during the $1^{st}$ step as shown in FIG. 10A). For example, the microspheres or deposit polydisperse microspheres may be sintered to increase the fill fraction.

The radial distribution function of randomly packed microspheres typically exhibits small bumps roughly near integer multiples (2, 3, . . . ) of 2R, as seen in FIG. 6. This feature is a signature of a short-range order that is due to the non-zero size of the monodisperse microspheres. The degree of short-range order can be controlled by using polydisperse microspheres. For example, for microsphere structures with two different sizes, the height of the small bumps in the radial distribution function will be less than the monodisperse structures. In this case, the distance in the radial distribution function will be normalized by the average diameter of the two. Thus, by controlling the polydispersity of microspheres, the degree of short-range order similar to that in white beetle scales may be obtained.

Measuring l* of the prepared samples allows for the investigation of the relationship between l* and the anisotropic radial distribution function while paying particular attention to the effect of anisotropy on l* to understand why white beetles need anisotropy in their microstructures. While white beetle scales consist of a network of fibrils (FIG. 7), the GaP structure that exhibited very strong scattering has a network of pores. Comparing scattering properties of the structures in steps FIGS. 10D and 10F, which correspond to a network of pores and fibrils, respectively, is justified when the refractive index of the polymer is sufficiently similar to that of silica (n=1.46).

For isotropic samples, a computer program may be used to calculate l* based on measured radial distribution function. The program generated the results in FIG. 3. When the structure factor is non-unity, the l* is obtained by $$l^* = \frac{\int_0^{2k} F(q) q^3 dq}{\int_0^{2k} F(q) S(q) q^3 dq} l_0^*, \tag{6}$$

To where k is the wavevector, F is the form factor obtained from the Mie scattering theory, and $l_0^*$ is the transport mean free path with a unity structure factor.[45]

Because $l_0^*$ and F are already calculated in our current program, we will use the structure factor S to find $l^*$ from Eq. (6). The structure factor is obtained from Eq. (3) based on experimentally determined radial distribution function.

Control of Randomness

Photonic glasses and photonic crystals represent the two extreme cases of photonic media, as they are perfectly random and perfectly ordered, respectively. While an understanding of these materials is relatively well-advanced, there are no physical pictures that pertain to the intermediate region of the "material spectrum," where the interplay between order and disorder happens. In the field of photonic crystals, perturbation theory has long been used to explain the effect of slight disorder in the structures on their optical properties. As the degree of disorder increases, perturbation theory becomes incapable of describing the system. However, a recent experimental study on these materials has discovered interesting optical properties. For example, for solar photovoltaics, the control of spatial correlation in structures can improve light-trapping efficiency over both periodic and random structures.

The degree of randomness in microsphere-based 3D random media may be controlled by using both colloidal sedimentation and spray deposition. The degree of randomness may be characterized by the radial distribution function.

Colloidal Sedimentation: Slow sedimentation of colloidal microspheres induces f.c.c. crystals of a long-range order with a (111) plane as the film surface. The sedimentation process can be accelerated using a centrifuge up to a certain point without significantly affecting the order. For the sedimentation process, the degree of randomness in the self-assembled structure can be easily controlled by two methods: (1) inducing colloidal instability and (2) controlling sedimentation time.

Figure 12A:
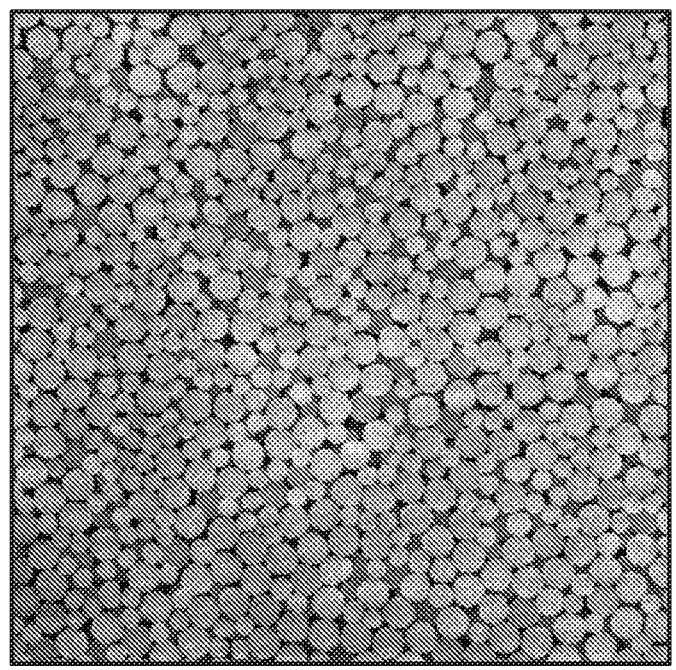
FIG. 12A shows samples prepared by colloidal sedimentation without adding a salt.
Figure 12B:
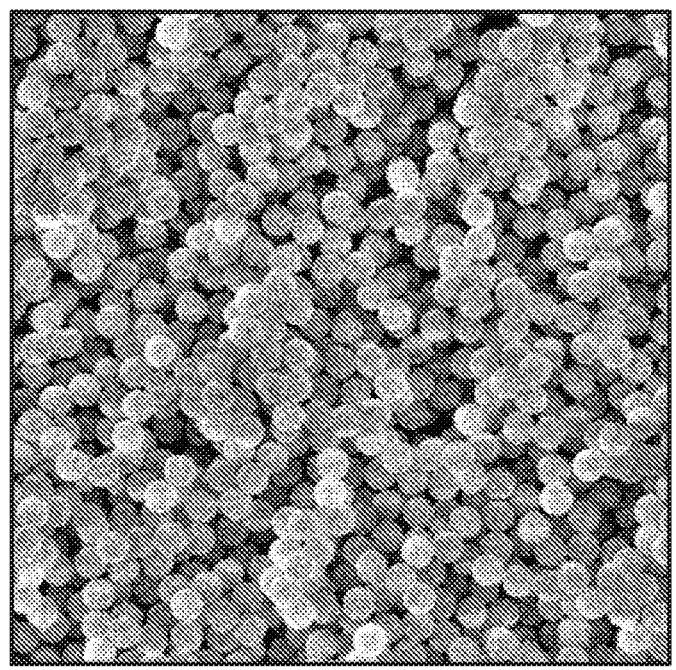
FIG. 12B shows samples prepared by colloidal sedimentation with adding a salt.

To control the colloidal stability, it is known that colloidal microspheres in a suspension are often charged, and the interaction between the spheres becomes repulsive. When the repulsive force is greater than the van der Waals attraction force, the colloidal suspension is stable. However, when a salt is added to the solution, the repulsive potential barrier is lowered. As a result, the microspheres coagulate when the electrolyte concentration exceeds a limit known as the critical coagulation concentration. This coagulation process leads to the introduction of randomness into the structure. FIGS. 12A and 12B compare the top view images of the samples prepared (a) without and (b) with adding a salt. Without a salt, the surface of the microsphere film is flat, and some ordering of microspheres can be recognized. In this case, while the microspheres are almost monodisperse, a very small number of microspheres that are smaller than the average size is concentrated in regions near the top surface. The polydispersity in FIG. 12A is not typical of the sample surfaces that have been observed. In comparison, when a salt is added, a region of noticeable polydispersity could not be located, and the microsphere arrangement is quite random. Thus, the degree of randomness in the structures may be controlled by varying the concentration of salt near the critical coagulation concentration.

Second, in yet another embodiment, the present invention accelerates the sedimentation process by centrifugation. An acceleration of ~400 g (g is the gravitational acceleration) in a centrifuge produces well-ordered polystyrene microsphere structures. For silica microspheres, an acceleration of ~10 g would give a similar order, considering that the density difference between silica and water is about 40 times that between polystyrene and water. As the acceleration increases, the microspheres will pack without being given enough time to induce order, and the degree of randomness in the structure increases. Note that the sample in FIG. 12A was prepared from a thin (a few millimeters) layer of microsphere solution, and the stack thickness, in addition to acceleration, also impacts the level of randomness. Thus, by controlling the level of acceleration and the stack thickness during centrifugation, the level of randomness in the $SiO_2$ microsphere structures may be adjusted.

Using spray deposition provides a method to control randomness in the deposited material by controlling parameters such as nozzle pressure, nozzle type, solvent, etc. Among these parameters, the present invention focusses on (1) the surfactant concentration in the microsphere solution and (2) the substrate temperature.

Figure 13D:
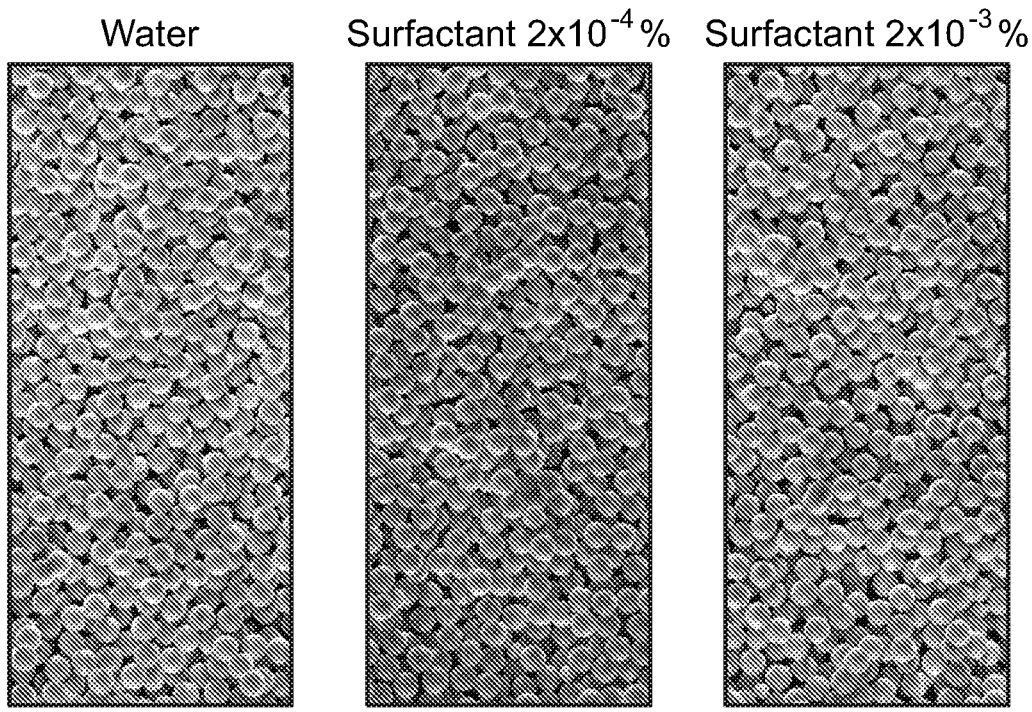
FIG. 13D shows the I* spectrum for the embodiments shown in FIGS. 13A-C.
Figure 13D:
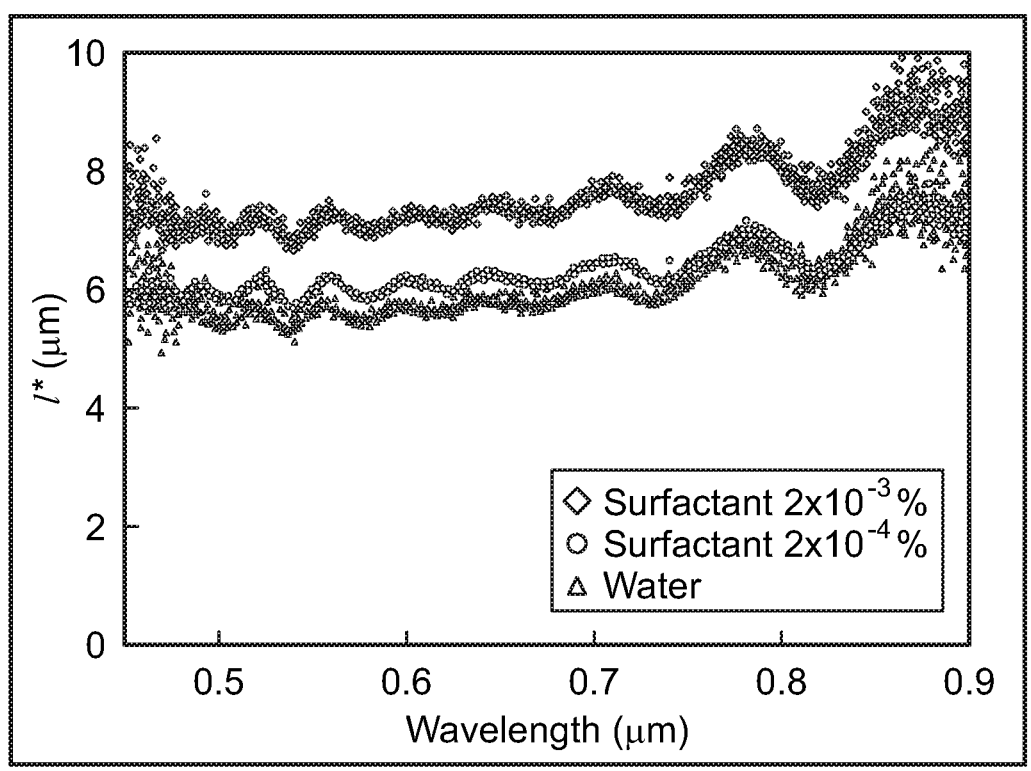

The degree of randomness may be increased by adding a surfactant to the microsphere solutions. FIGS. 13A-13C show the SEM images of the top surface of the spray-deposited samples with different surfactant concentrations. The microsphere arrangement appears to be quite random in all three images. As shown in FIG. 13D, measurements reveal that $l^*$ increases as the surfactant concentration increases. In the visible wavelengths, $l^*$ increases by ~1.7 μm when $2\times10^{-3}$% of the surfactant is added. The results show that the microsphere arrangement is significantly affected by the surfactant concentration in the microsphere solution.

Controlling the substrate temperature to control the degree of randomness may also be used. When the substrate temperature is much lower than the solvent boiling point, the solvent on the substrate evaporates slowly. The slow evaporation creates time for the microspheres to rearrange into close hexagonal packing. The close packing happens because the surface tension of the meniscus draws the microspheres together. When the substrate temperature is near and above the solvent boiling point, evaporation happens almost instantly, and the microsphere rearrangement into a crystallite is prevented. FIG. 13A shows the image of a sample resulting from such a process. When the substrate temperature is maintained at a temperature significantly higher than the boiling point (e.g., ~150° C. for water), the fine liquid droplets from the spray nozzle, which contain microspheres, levitate or even bounce multiple times above the substrate. The effect, known as the Leidenfrost effect, creates an insulating vapor layer between the droplet and the substrate, preventing a direct contact between them. As the droplet evaporates while levitating, the microspheres pile up at the surface of the droplet, and the rheological properties of the shell layer become quite different from those of the inner region of the droplet. This can cause the instability of the drying process, and the droplets are buckled. This instability can result in nontrivial arrangements of microspheres.

Radiative Cooling in Terrestrial and Extraterrestrial Space

Figure 14:
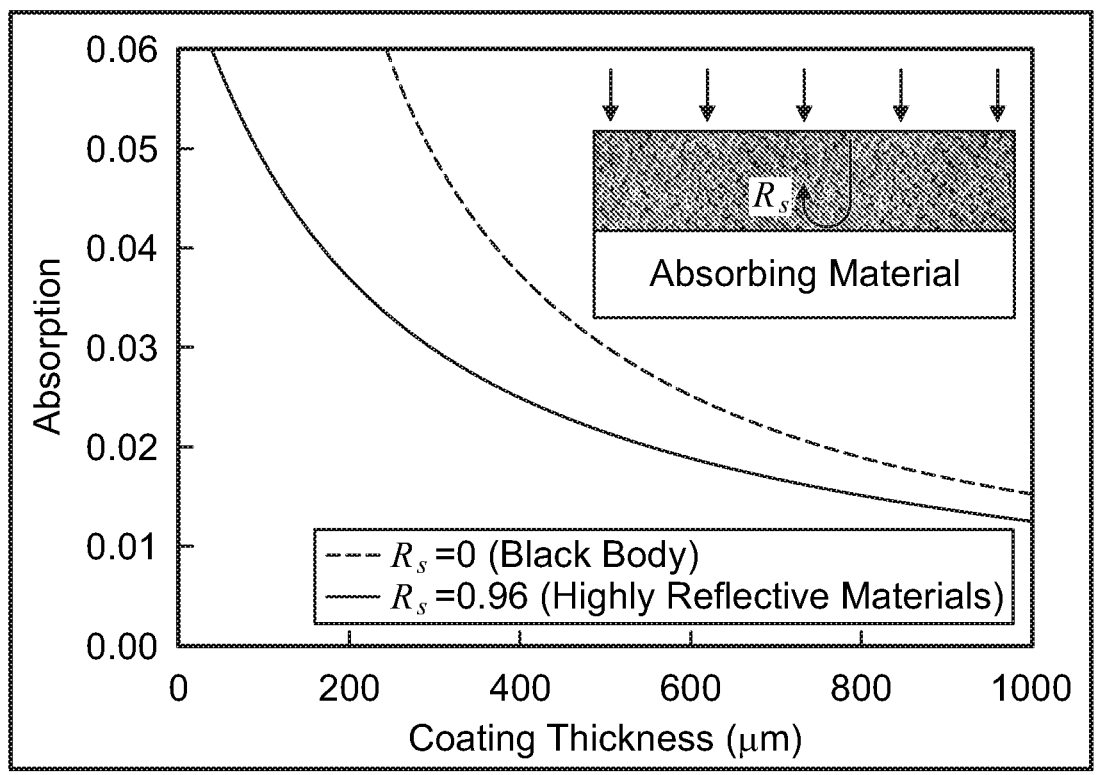
FIG. 14 shows the absorption of a substrate with a microsphere-based coating for I*=6.4 mm as a function of coating thickness for two extreme values of internal reflectance $R_s$ at the coating/substrate interface.

The teachings of the present invention show the embodiments described will enable strong sunlight scattering in the thinnest possible films. For example, even for the non-optimized sample that resulted in effective radiative cooling shown in FIG. 4, the solar absorption is only ~0.02 when the coating thickness is 700 μm (see FIG. 14). For this sample, the solar average $l^*$ is 6.4 μm. Considering that the $l^*$ of white beetles in the visible spectrum is as small as 1.47 μm, the required coating thickness for the optimized structures to have the same absorption of ~0.02 would be only ~160 μm. This thickness is comparable to the typical thickness of automotive paint finish (60-180 μm).

For radiative cooling under sunlight in the terrestrial environment, the relevant mid-IR emissivity is confined to a narrow band of atmospheric transparency window (see FIG. 1). Mid-IR emission outside of this window degrades the cooling effectiveness by facilitating radiative heat exchange between the material and the environment. Thus, efforts have been made in the past to enhance the emissivity only in the transparency window while suppressing the emissivity outside the window. However, the impact of this spectrally select emissivity is significant only when the heat transfer by convection and conduction from the ambient air is negligible. Because the coating for radiative cooling would be exposed to the ambient air in common terrestrial outdoor situations, where convective/conductive heat transfer is substantial, there has been no attempt to increase the spectral selectivity in the emissivity spectrum of thecoating. Rather, the present invention makes use of the very broad high emissivity of most oxide materials to target extraterrestrial situations. Without atmosphere, radiative heat loss is through the broad spectrum that is covered by the Planck function for black-body radiation. The films of the present invention of silica microspheres have a high emissivity over a broadband 3-60 μm (see FIG. 1), which is useful for radiative cooling at temperatures below ~300° C. It is noted that practical temperatures found in many extraterrestrial situations (e.g., the earth orbit) are below ~300° C. Moreover, silica is very resilient to high-energy cosmic radiation, and the radiation resistance can be enhanced by chemical treatments. By applying a thin transparent conducting oxide layer on top of the random media, the present invention can also prevent arcing and enhance its durability in extraterrestrial space. Therefore, random media of oxide microspheres have great potential for extraterrestrial heat management.

Figure 15A:
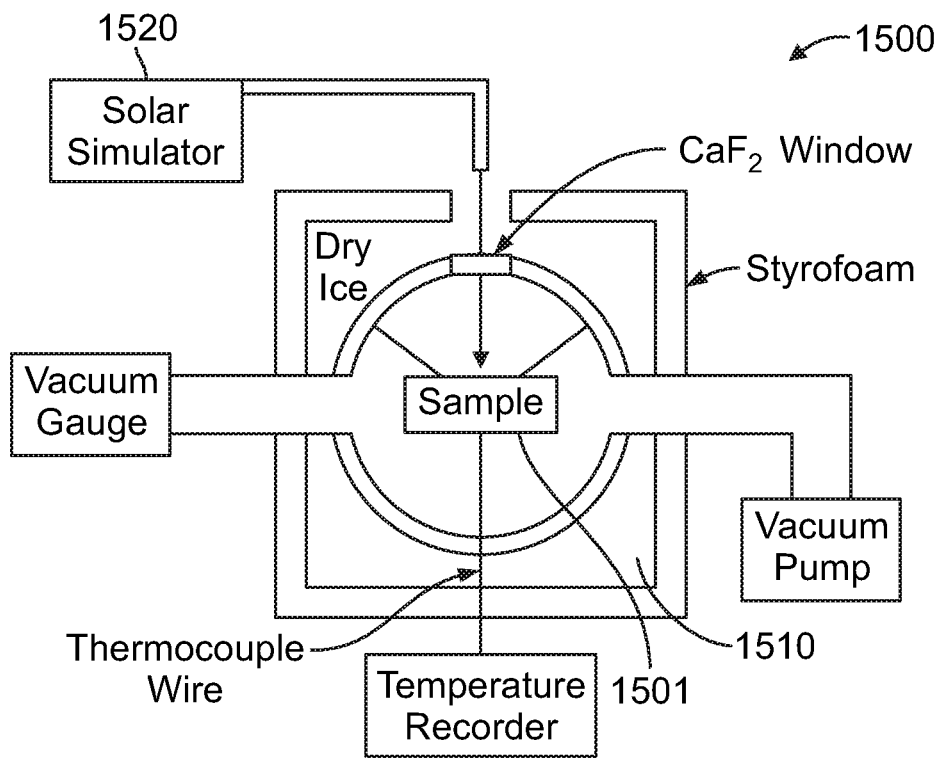
FIGS. 15A and 15B illustrate a setup to measure the radiative cooling characteristics of samples under illumination by a solar simulator in an environment that resembles extraterrestrial space.
Figure 15B:
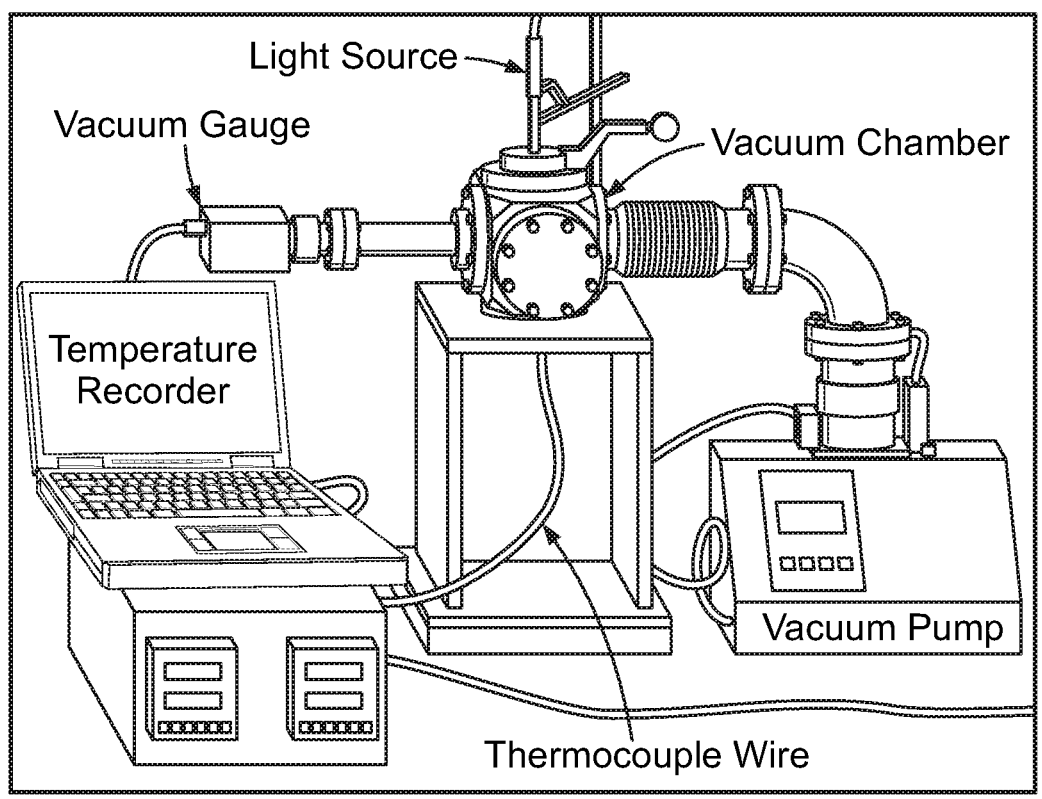

To simulate extraterrestrial situations, the temperature measurement system, 1500 shown in FIGS. 15A and 15B was used. This system provides the samples with an environment that resembles extraterrestrial space. A sample 1501 is located within a vacuum chamber 1510 and is illuminated by a solar simulator. The wall inside the chamber is painted black to absorb both the thermal radiation and the scattered light from the sample. The wall is maintained at −78.5° C. by contacting with dry ice contained in a Styrofoam enclosure. When the sample temperature is much higher than the wall temperature, radiative heating of the samples by thermal radiation from the wall is negligible. The light from the solar simulator 1520 illuminates the sample through a small $CaF_2$ window that is transparent over the solar spectrum. The area of the window is much smaller than the surface area of the vacuum chamber so that the effect of the outside environment is negligible. The sample is held in the vacuum chamber by thin white strings. The thermal conduction by the string is negligible compared to that by the thermocouple wire attached to the sample. Thermal conduction by the wire is difficult to avoid but is much smaller than radiative heat transfer.

Figure 16:
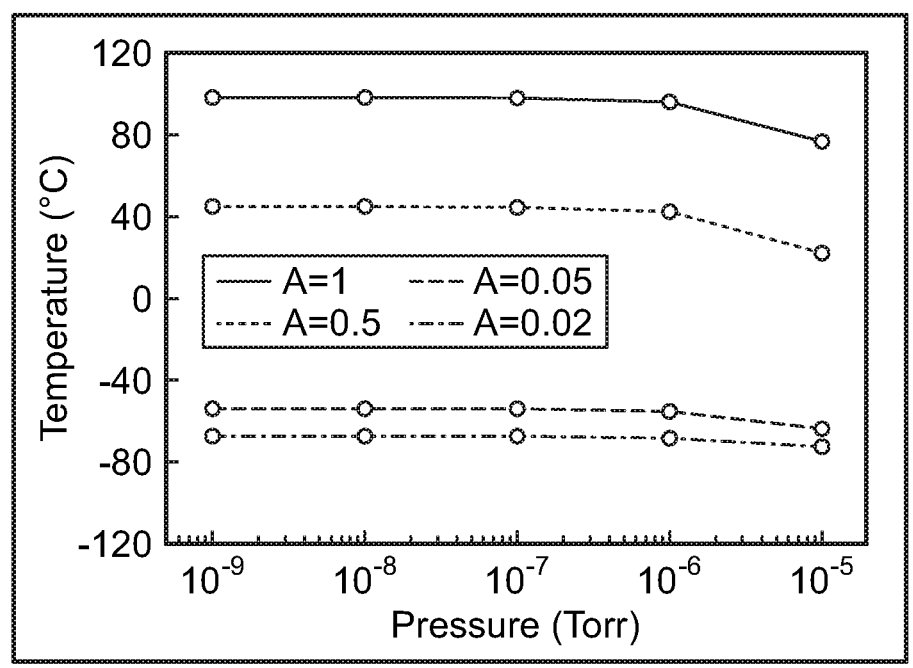
FIG. 16 shows the calculated dependence of sample temperature on the vacuum level for the setup in FIG. 15 for different values of absorption.

A simulation of the temperature measurement setup 1500 was performed. In the simulation, the thermal conduction by the thermocouple wire was considered. FIG. 16 shows the simulation results that give the sample temperature as a function of the vacuum level, for different solar average absorption by the sample. When the vacuum level is less than $10^{-6}$ Torr, the pressure dependence of the sample temperature is almost negligible for any absorption. The initial run for our setup reached a pressure of $2.6 \times 10^{-7}$ Torr, ensuring the pressure independence. For the sample that has absorption (A) of 0.02, the calculated sample temperature is minus 67.5° C., which is higher than the environment temperature (−78.5° C.) by 11° C. When absorption is A=0.05, the sample temperature increases to −53.7° C. Thus, the slight increase in absorption by 0.03 leads to a significant temperature increase of ~14° C. For comparison, that the base surface is a gray body (A=0.5) or a black body (A=1) was also considered. In these cases, the sample temperature is 45.1° C. and 98.5° C., respectively. The dependence of the sample temperature on the absorption is much greater than that in terrestrial radiative cooling. This is because the heat removal of the sample through the mid-IR radiation covers a very broad spectrum for an extraterrestrial case, while a narrow atmospheric transparency window is used for terrestrial cooling. It is noted that the dependence of the sample temperature on absorption in the experiment would be weaker than that in actual extraterrestrial space because the experiment allows the thermal conduction through the thermocouple wire that weakens the dependence.

In a preferred of the present invention, the radiative cooling properties of media for use in a terrestrial environment and an environment that resembles extraterrestrial space, respectively, the media may have a structure factor similar to that of white beetle scales. The structure factor of the media should be optimized to achieve maximum scattering when averaged over the solar spectrum.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A method to create a structure that mimics the light scattering properties of a random structural pattern comprising the steps of:
   infiltrating a structure with a polymer to create a multiple layer composite, said composite having a random structural pattern therein;
   polishing said composite in a layer-by-layer fashion to expose a portion of said random structural pattern;
   intermittently capturing SEM images of said exposed portion and obtaining an image of the surface of the exposed portion; and
   finding the radial distribution of said random structural pattern from the SEM images to determine the structure of said random structural pattern.

2. The method of claim 1 wherein said radial distribution function is determined in three directions.

3. The method of claim 1 wherein said radial distribution function is used to fabricate microsphere-based structures that mimic the radial distribution function of the random structural pattern.

4. The method of claim 3 wherein said fabrication includes the step of using colloidal sedimentation to create randomly packed microspheres.

5. The method of claim 3 wherein said fabrication includes the step of spray coating microspheres to create randomly packed microspheres.

6. The method of claim 4 wherein an electrolyte is added.

7. The method of claim 4 wherein an electrolyte is added to a stable colloidal suspension of $SiO_2$ microspheres.

8. The method of claim 4 wherein an electrolyte is added to a concentration that exceeds the critical coagulation concentration so as to create randomness into the structure.

9. The method of claim 4 further including the step of accelerating the sedimentation by centrifugation.

10. The method of claim 5 further including the step of adding a surfactant to the spray coating to increase the degree of randomness of the coating.

\* \* \* \* \*